(12) United States Patent
Tegen et al.

(10) Patent No.: US 10,164,086 B2
(45) Date of Patent: Dec. 25, 2018

(54) VERTICAL FIELD EFFECT TRANSISTOR DEVICE HAVING ALTERNATING DRIFT REGIONS AND COMPENSATION REGIONS

(71) Applicant: Infineon Technologies Austria AG, Villach (AT)

(72) Inventors: Stefan Tegen, Dresden (DE); Dirk Manger, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 12 days.

(21) Appl. No.: 15/273,400

(22) Filed: Sep. 22, 2016

(65) Prior Publication Data

US 2017/0084734 A1 Mar. 23, 2017

(30) Foreign Application Priority Data

Sep. 23, 2015 (DE) .................. 10 2015 116 040

(51) Int. Cl.
*H01L 29/423* (2006.01)
*H01L 29/78* (2006.01)
(Continued)

(52) U.S. Cl.
CPC .... *H01L 29/7811* (2013.01); *H01L 21/26513* (2013.01); *H01L 21/823481* (2013.01);
(Continued)

(58) Field of Classification Search
CPC ........... H01L 21/761; H01L 21/823481; H01L 21/823487; H01L 27/105; H01L 29/1033;
(Continued)

(56) References Cited

U.S. PATENT DOCUMENTS 6,551,909 B1 4/2003 Fujihira
6,982,459 B2 1/2006 Suzuki et al.
(Continued)

FOREIGN PATENT DOCUMENTS

CN 203659870 U 6/2014
DE 10224201 B4 11/2010

*Primary Examiner* — Stephen W Smoot
(74) *Attorney, Agent, or Firm* — Murphy, Bilak & Homiller, PLLC

(57) ABSTRACT

A semiconductor device includes a plurality of drift regions of a vertical field effect transistor arrangement arranged in a semiconductor substrate. The plurality of drift regions has a first conductivity type. The semiconductor device further includes a plurality of compensation regions arranged in the semiconductor substrate. The plurality of compensation regions has a second conductivity type. Each drift region of the plurality of drift regions is arranged adjacent to at least one compensation region of the plurality of compensation regions. The semiconductor device further includes a body region of a transistor structure of the vertical field effect transistor arrangement arranged adjacent to a drift region of the plurality of drift regions. The semiconductor device further includes a gate extending substantially vertically along the body region of the transistor structure for controlling a substantially vertical channel region between a first doping region of the transistor structure and the drift region.

22 Claims, 25 Drawing Sheets

(51) Int. Cl.
*H01L 29/10* (2006.01)
*H01L 29/06* (2006.01)
*H01L 29/66* (2006.01)
*H01L 21/265* (2006.01)
*H01L 29/739* (2006.01)
*H01L 21/8234* (2006.01)
*H01L 29/45* (2006.01)

(52) U.S. Cl.
CPC .. *H01L 21/823487* (2013.01); *H01L 29/0634* (2013.01); *H01L 29/1033* (2013.01); *H01L 29/1095* (2013.01); *H01L 29/4236* (2013.01); *H01L 29/66348* (2013.01); *H01L 29/66666* (2013.01); *H01L 29/66734* (2013.01); *H01L 29/7397* (2013.01); *H01L 29/7813* (2013.01); *H01L 29/7827* (2013.01); *H01L 29/0696* (2013.01); *H01L 29/4238* (2013.01); *H01L 29/456* (2013.01)

(58) Field of Classification Search
CPC ............ H01L 29/4236; H01L 29/4238; H01L 29/66666; H01L 29/7397; H01L 29/7827; H01L 29/783
See application file for complete search history.

(56) References Cited

U.S. PATENT DOCUMENTS

| | | |
|---|---|---|
| 7,790,549 B2 | 9/2010 | Hébert |
| 8,853,776 B2 | 10/2014 | Hirler et al. |
| 2004/0224455 A1 | 11/2004 | Henson et al. |
| 2006/0011962 A1* | 1/2006 | Kocon ............... H01L 21/3065 257/302 |
| 2008/0038850 A1* | 2/2008 | Yamaguchi ..... H01L 21/823814 438/17 |

* cited by examiner

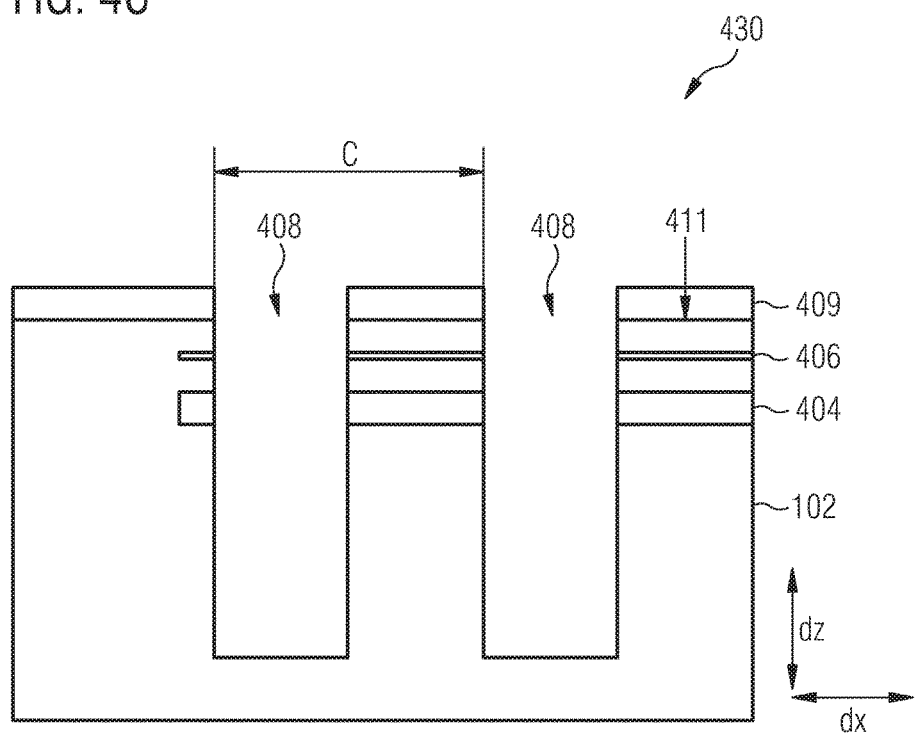

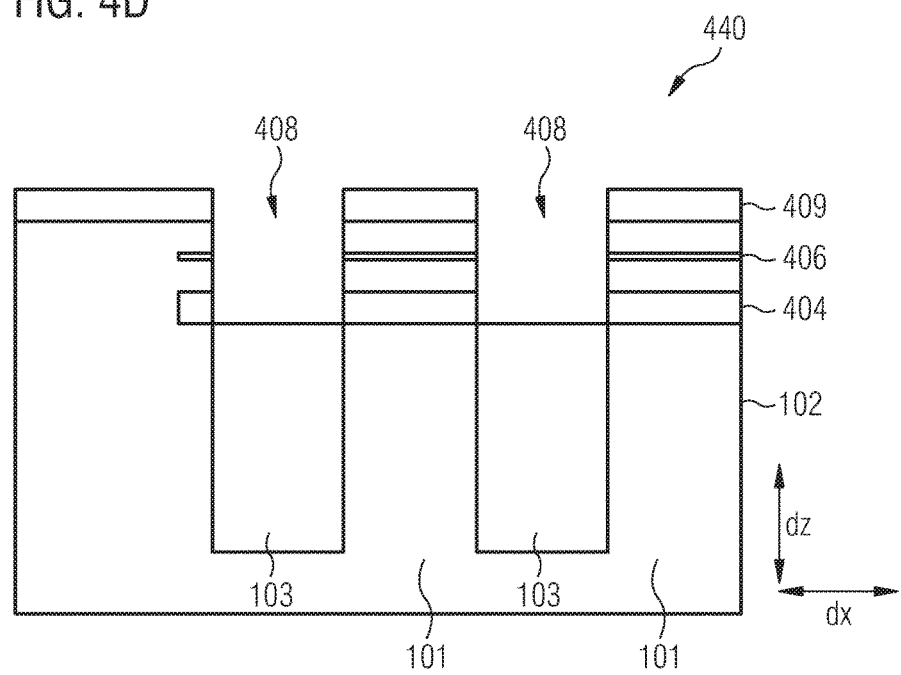

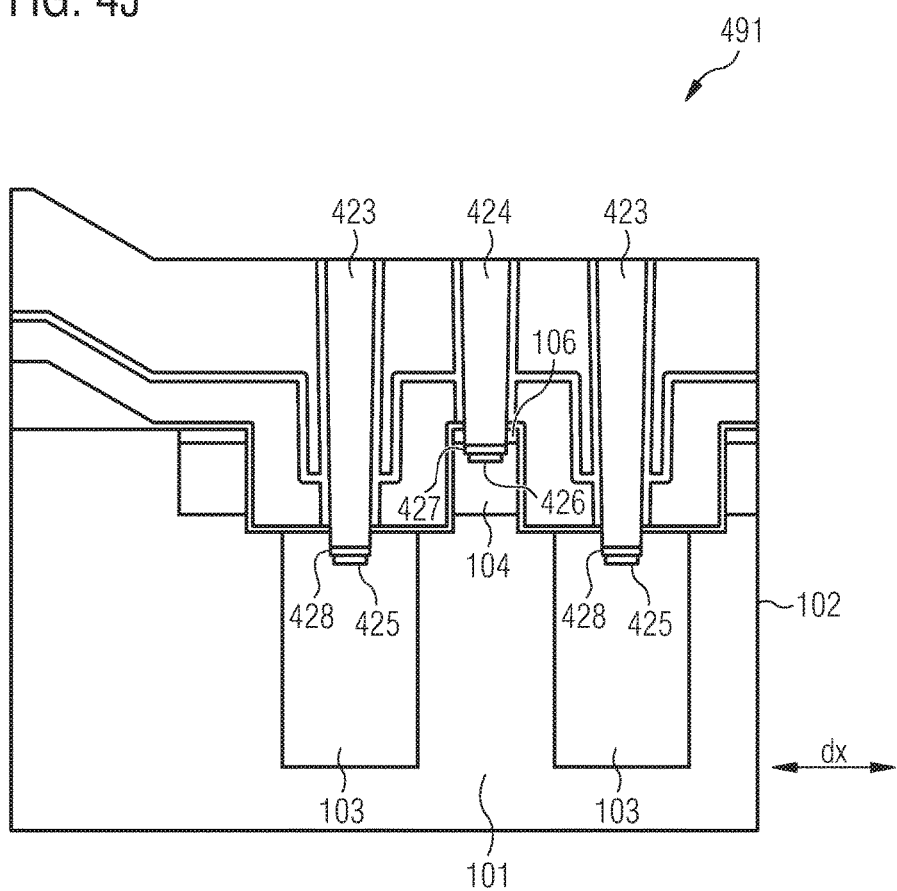

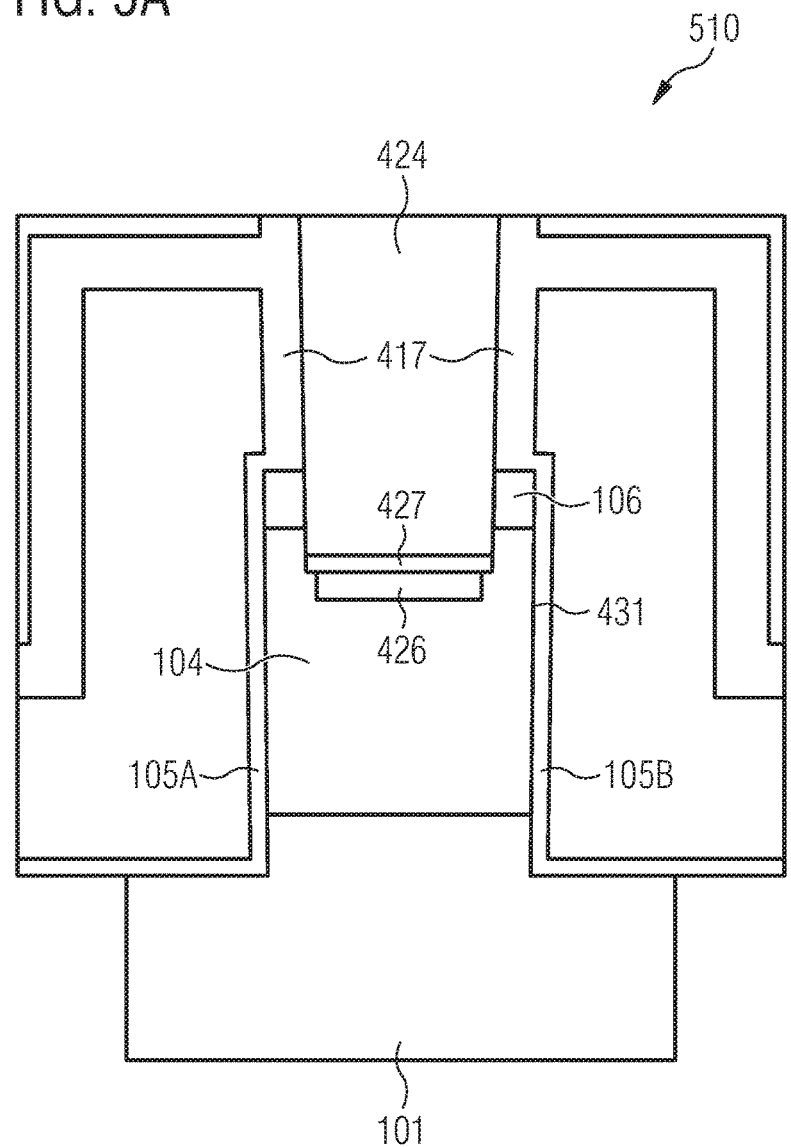

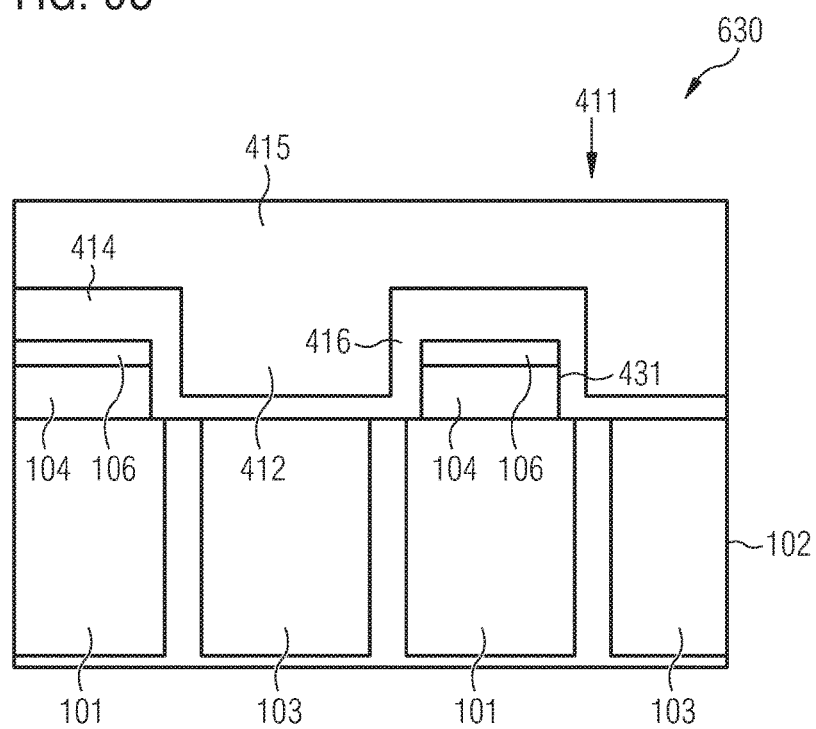

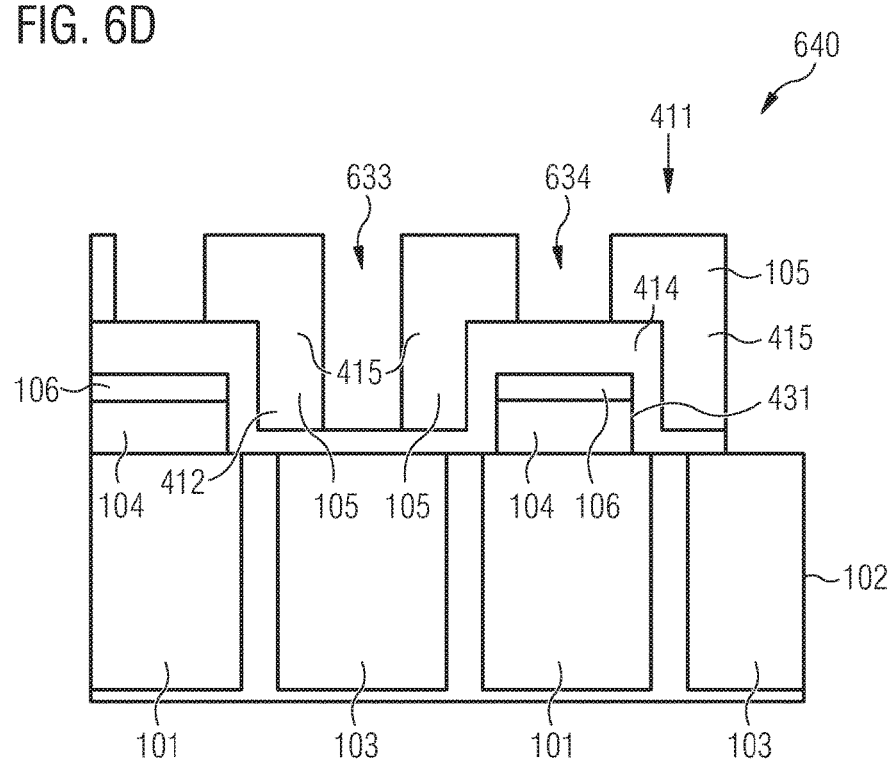

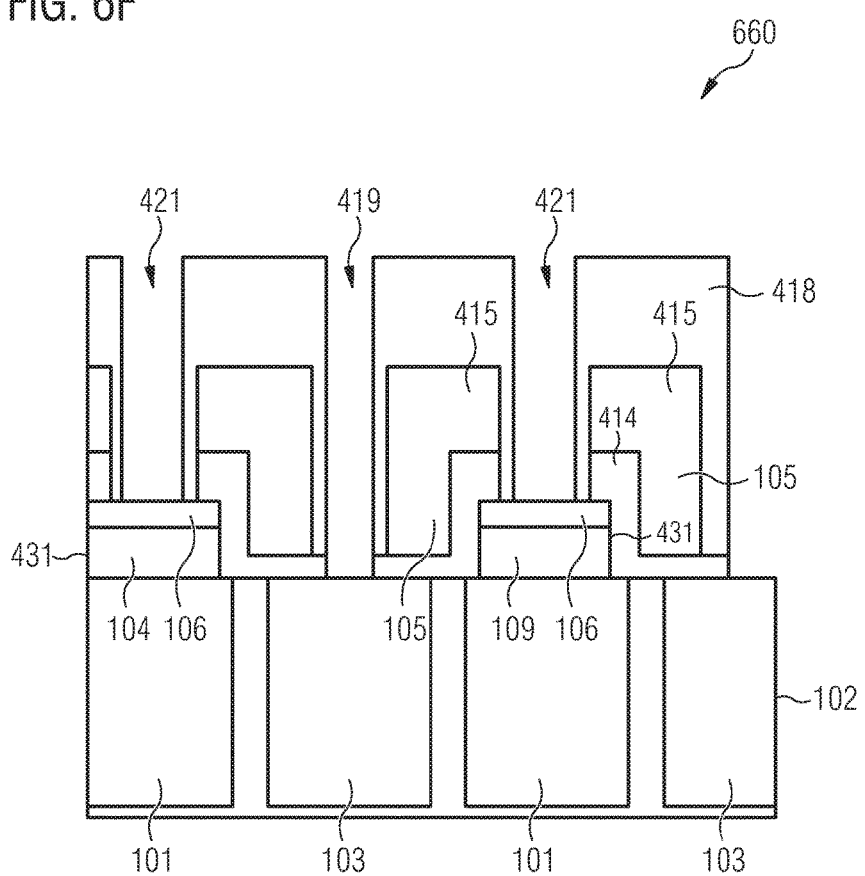

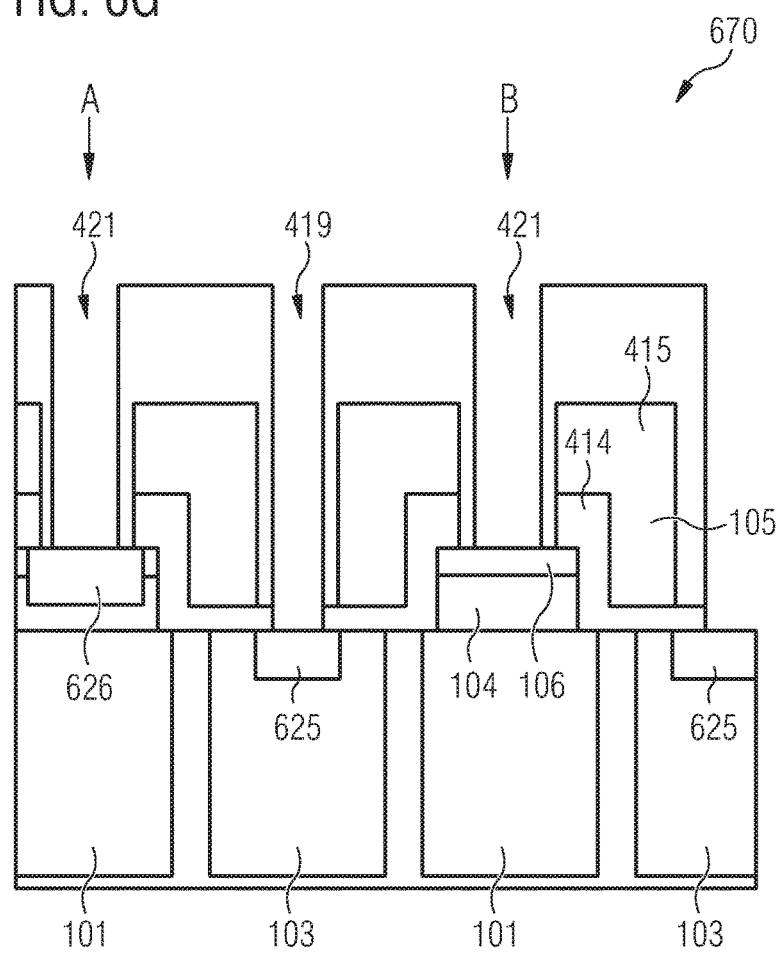

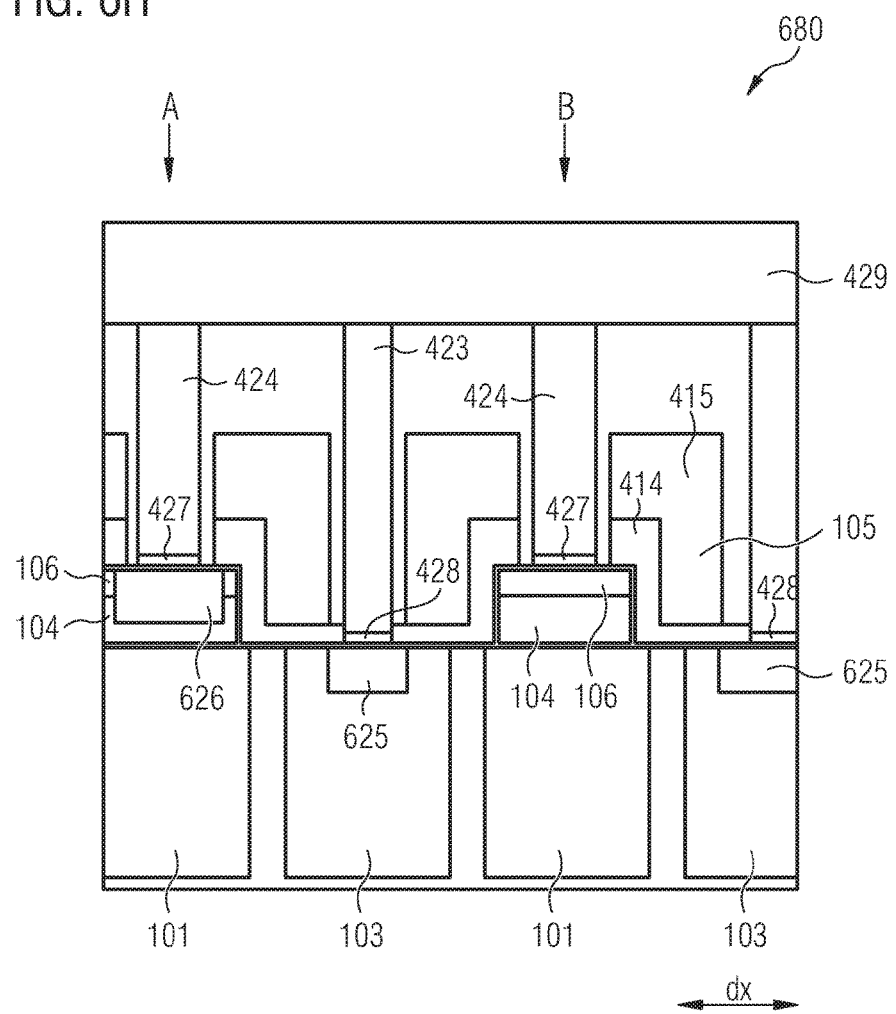

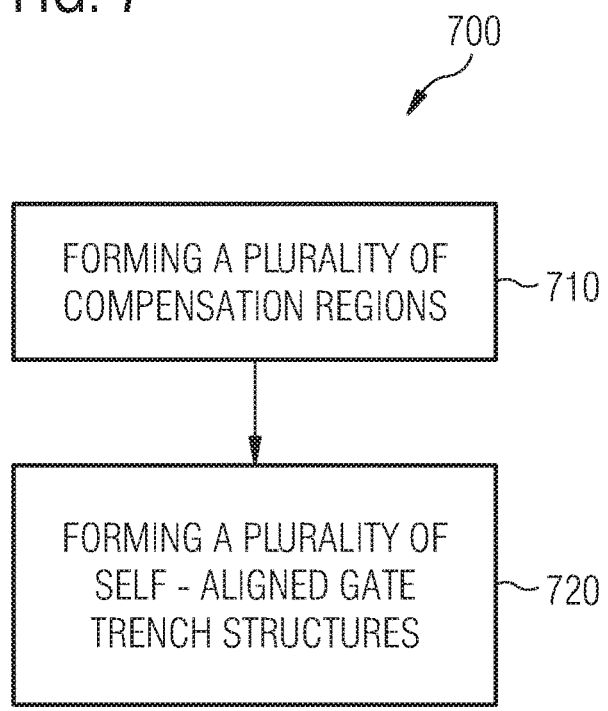

VERTICAL FIELD EFFECT TRANSISTOR DEVICE HAVING ALTERNATING DRIFT REGIONS AND COMPENSATION REGIONS

TECHNICAL FIELD

Embodiments relate to transistor structures, and in particular to semiconductor devices and a method for forming a semiconductor device.

BACKGROUND

Shrinkage of transistor devices may lead to the short channel length effects such as drain-induced barrier lowering or effects from hot electrons. Channel lengths may depend on the pitch or size of the transistors and short channel length effects may become more significant with the shrinkage of transistor devices, leading to less reliable transistor devices.

SUMMARY

It is a demand to provide a concept for semiconductor devices which provide increased reliability in transistor structures of smaller dimensions.

Some embodiments relate to a semiconductor device. The semiconductor device comprises a plurality of drift regions of a vertical field effect transistor arrangement arranged in a semiconductor substrate. The plurality of drift regions comprises a first conductivity type. The semiconductor device further comprises a plurality of compensation regions arranged in the semiconductor substrate. The plurality of compensation regions comprises a second conductivity type. Each drift region of the plurality of drift regions is arranged adjacent to at least one compensation region of the plurality of compensation regions. The semiconductor device further comprises a body region of a transistor structure of the vertical field effect transistor arrangement arranged adjacent to a drift region of the plurality of drift regions. The semiconductor device further comprises a gate extending substantially vertically along the body region of the transistor structure for controlling a substantially vertical channel region between a first doping region of the transistor structure and the drift region.

Some embodiments relate to a semiconductor device. The semiconductor device comprises a plurality of drift regions of a vertical field effect transistor arrangement arranged in a semiconductor substrate. The plurality of drift regions comprises a first conductivity type. The semiconductor device further comprises a plurality of compensation regions arranged in the semiconductor substrate. The plurality of compensation regions comprises a second conductivity type. Each drift region of the plurality of drift regions is arranged adjacent to at least one compensation region of the plurality of compensation regions. The semiconductor device further comprises a body region of a transistor structure of the vertical field effect transistor arrangement arranged adjacent to a drift region of the plurality of drift regions. The compensation regions and the body region of the transistor structure are separated within the semiconductor substrate by at least one p-n junction.

Some embodiments relate to a method for forming a semiconductor device. The method comprises forming a body implant region of a vertical field effect transistor arrangement. The method further comprises forming a plurality of compensation regions in the semiconductor substrate after forming the body implant region of the vertical field effect transistor arrangement.

Some embodiments relate to a method for forming a semiconductor device. The method comprises forming a plurality of compensation regions comprising semiconductor material within a plurality of compensation trench structures located in a semiconductor substrate. The method further comprises forming a plurality of self-aligned gate trench structures based on portions of the plurality of compensation trench structures without semiconductor material.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which

FIGS. 4A to 4K show schematic illustrations of a method for forming a semiconductor device;

FIG. 5A shows a schematic illustration of a first doping region contact structure of a transistor structure of the semiconductor device;

FIGS. 6A to 6J show schematic illustrations of a further method for forming a semiconductor device; and FIG. 7 shows a flow chart of a further method for forming a semiconductor device.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
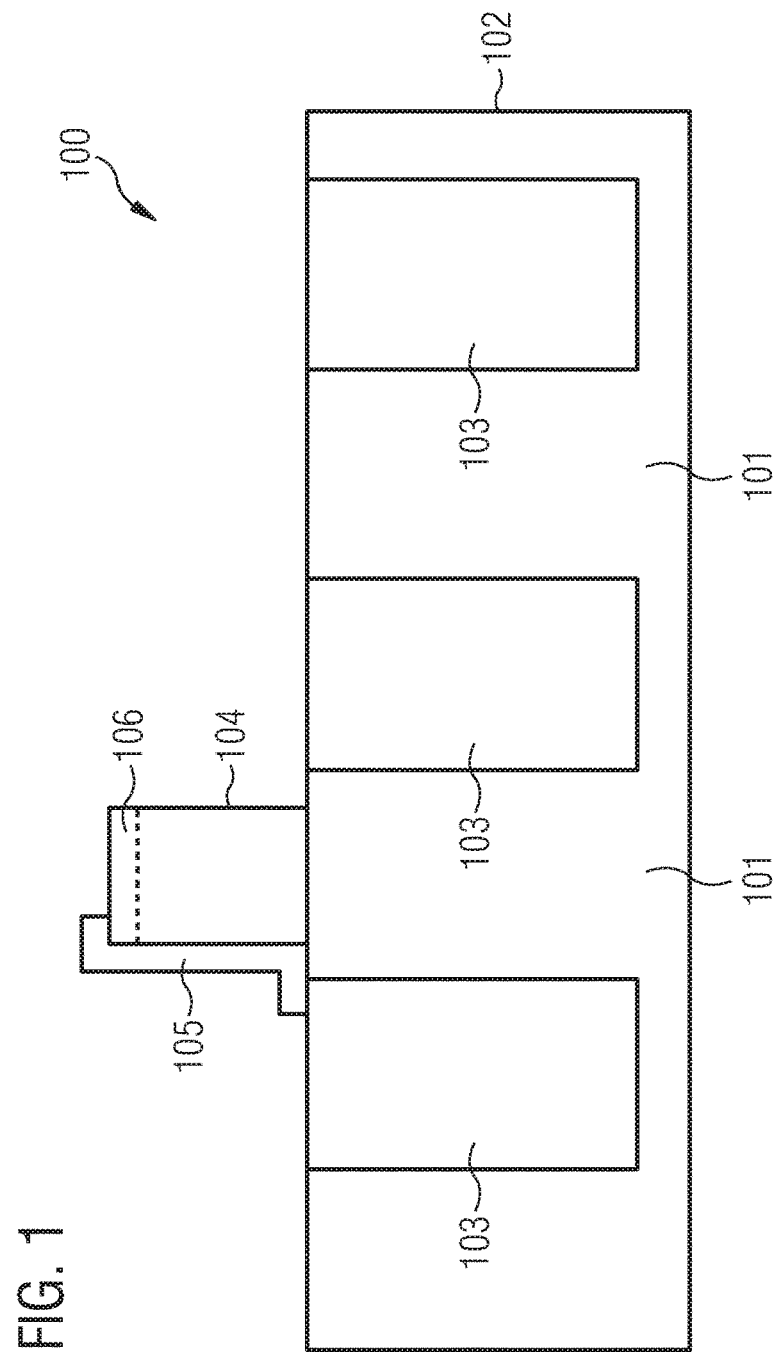
FIG. 1 shows a schematic illustration of a semiconductor device.

FIG. 1 shows a schematic illustration of a semiconductor device 100 according to an embodiment.

The semiconductor device 100 comprises a plurality of drift regions 101 of a vertical field effect transistor arrangement arranged in a semiconductor substrate 102. The plurality of drift regions 101 comprises a first conductivity type.

The semiconductor device 100 comprises a plurality of compensation regions 103 arranged in the semiconductor substrate 102. The plurality of compensation regions 103 comprises a second conductivity type. Each drift region 101 of the plurality of drift regions 101 is arranged adjacent to at least one compensation region 103 of the plurality of compensation regions 103.

The semiconductor device 100 comprises a body region 104 of a transistor structure of the vertical field effect transistor arrangement arranged adjacent to a drift region 101 of the plurality of drift regions 101.

The semiconductor device comprises a gate 105 extending substantially vertically along the body region 104 of the transistor structure for controlling a substantially vertical channel region between a first doping region 106 of the transistor structure and the drift region 101.

Due to the gate 105 extending substantially vertically along the body region 104 of the transistor structure, a more reliable semiconductor device 100 may be obtained. For example, the channel length of the transistor structure may be controlled independently from the lateral width (or pitch) of the cell or transistor structure, for example. Thus shrinkage of the transistor structure may be less susceptible to short channel effects, for example. Furthermore, the reliability and/or durability of the semiconductor device 100 and/or the on-state resistance and/or the breakdown or blocking voltage may be improved due the efficient removal of charge carriers from the drift regions 101 by the adjacent compensation regions 103, for example.

The plurality of drift regions 101 may be part of a common drift zone of the vertical field effect transistor arrangement. For example, the plurality of drift regions 101 may part of a common drift zone located in the semiconductor substrate 102, for example. For example, the plurality of drift regions 101 may be connected or joined to each other by a commonly doped region. For example, the drift regions 101 may be connected to each other below the compensation regions 103 by a common or shared part of the drift zone.

The plurality of drift regions 101 may extend from body regions 104 of the vertical field effect transistor arrangement between the compensation regions 103 vertically into the semiconductor substrate 102. For example, the (or each) drift region 101 of the plurality of drift regions 101 may be arranged between neighboring compensation regions 103 in the semiconductor substrate, and may extend from the body region 104 vertically into the semiconductor substrate 102.

Each drift region 101 of the plurality of drift regions 101 may be arranged adjacent to at least one compensation region 103 of the plurality of compensation regions 103. Additionally or optionally, each drift region 101 may be arranged between neighboring compensation regions 103, for example. The drift regions 101 in the semiconductor substrate 102 may be separated from each other by the compensation regions 103 down to the depth of the compensation regions 103.

The drift regions 101 may carry the majority or the complete current flowing between the front side and the back side of the semiconductor substrate 102 in an on-state of the vertical field effect transistor arrangement, for example. For example, each drift region 101 of a transistor structure may carry charge carriers (or current) between the vertical channel (of the body region 104) of the transistor structure to an electrode located at the back side surface of the semiconductor substrate 102.

The plurality of drift regions 101 may have a doping of the first conductivity type. A region comprising the first conductivity type may be a p-doped region (e.g. caused by incorporating aluminum ions or boron ions) or an n-doped region (e.g. caused by incorporating nitrogen ions, phosphor ions or arsenic ions). Consequently, the second conductivity type indicates an opposite n-doped region or p-doped region. For example, the first conductivity type may indicate an n-doping and the second conductivity type may indicate a p-doping or vice-versa.

The drift region 101 may have an average doping concentration of at least $1 \times 10^{18}$ dopant atoms per $cm^3$ (e.g. between $1 \times 10^{18}$ dopant atoms per $cm^3$ and $1 \times 10^{19}$ dopant atoms per $cm^3$). The average doping concentration may be a measured number of dopant atoms (e.g. acceptor dopant atoms) per volume averaged over a region of interest of the drift region 101, for example.

The plurality of compensation regions 103 may be regions of the semiconductor substrate 102 comprising a stripe-shape, a circular-shape or a hexagonal shape in a top view of the semiconductor device 100. A stripe-shape may be a geometry extending in a second lateral direction significantly farther than in an orthogonal first lateral direction. For example, a compensation region 103 may comprise a lateral length of more than 100× (or more than 500× or more than 1000×) a lateral width of a compensation region 103 of the plurality of compensation regions. The lateral length of the compensation regions 103 may be the largest extension along the front side surface of the semiconductor substrate and a lateral width (e.g. between 1 µm and 5 µm or between 2 µm and 3 µm) of the compensation region may be a shortest dimension of the compensation regions 103 along the front side surface of the semiconductor substrate. The compensation regions of the plurality of compensation regions may all comprise the same lateral length and/or the same lateral width. Alternatively, the lateral length and/or the lateral width of the compensation regions of the plurality of compensation regions 103 may differ at least partly from each other. Neighboring compensation regions 103 of the plurality of compensation regions 103 may be separated in at least one lateral direction (e.g. the first lateral direction) by a lateral distance of less than 20 μm (or less than 10 μm or less than 5 μm, or e.g. about 4 μm), for example.

Further, the compensation regions 103 of the plurality of compensation regions 103 comprise a vertical extension (e.g. vertical depth). In other words, the compensation regions 103 may be laminar structures or may comprise the geometry of a pillar, a wall or a plate. The vertical extension may be larger than the lateral width and shorter than the lateral length, for example. For example, the compensation regions 103 of the plurality of compensation regions 103 may extend from a front side surface of the semiconductor substrate 102 into a depth of more than 10 μm (or more than 20 μm or more than 50 μm). For example, a compensation region 103 of the plurality of compensation regions 103 may extend from a body region 104 of the vertical field effect transistor arrangement vertically into the semiconductor substrate 102 towards the back side surface of the semiconductor substrate 102.

The compensation regions 103 of the plurality of compensation regions 103 may extend laterally in one direction through the vertical field effect transistor arrangement, for example. Optionally, the compensation regions 103 of the plurality of compensation regions 103 may extend in the one direction also into an edge termination region. Alternatively, the compensation regions 103 of the plurality of compensation regions 103 may be significantly smaller than a lateral extension of the vertical field effect transistor arrangement (e.g. several compensation structures may be arranged in a line and several lines of compensation structures may be arranged in parallel to each other). For example, at least a part of the compensation regions 103 of the plurality of compensation regions may be arranged substantially in parallel to each other (e.g. neglecting manufacturing tolerances).

In a cross-section orthogonal to the lateral length of the plurality of compensation regions 103, the compensation regions 103 may comprise a pillar shape or column shape. The plurality of compensation regions 103 may be arranged alternating to the plurality of drift regions 101 of the vertical field effect transistor arrangement (in a cross section orthogonal to a lateral length of the compensation regions). For example, the plurality of compensation regions 103 may be arranged alternating to the plurality of drift regions 101 in a lateral direction. For example, a drift region 101 of the vertical field effect transistor arrangement may extend into the semiconductor substrate 102 between two compensation regions 103 within the semiconductor device 100.

The compensation regions 103 may have a doping of a second conductivity type. For example, a doping type of the compensations region may be opposite to the doping type of the drift regions 101, for example. The compensation region 103 may have an average doping concentration of at least $1 \times 10^{18}$ dopant atoms per $cm^3$ (or e.g. between $1 \times 10^{18}$ dopant atoms per $cm^3$ and $1 \times 10^{19}$ dopant atoms per $cm^3$), for example. The average doping concentration may be a measured number of dopant atoms (e.g. acceptor dopant atoms) per volume averaged over a region of interest of the compensation region 103, for example.

The semiconductor device 100 may be a compensation device (e.g. a super junction device), for example. Compensation devices may be based on mutual compensation of at least a part of the charge of n- and p-doped areas in the drift region of the vertical field effect transistor (FET) arrangement. For example, in a vertical FET arrangement, alternating p- and n-pillars or plates (e.g. a plurality of drift regions 101 and a plurality of compensation regions 103 in an alternating arrangement in a lateral direction) may be arranged in pairs. A compensation region 103 of the plurality of compensation regions 103 may comprise a laterally summed number of dopants per unit area of the second conductivity type (p or n) deviating from half of a laterally summed number of dopants per unit area of the first conductivity type (n or p) comprised by two drift regions 101 located adjacent to opposite sides of the compensation region by less than +/−25% (or less than 15%, less than +/−10%, less than +/−5%, +/− less than 2% or less than +/−1%) of the laterally summed number of dopants per unit area of the first conductivity type comprised by the compensation region 103. The lateral summed number of dopants per unit area may be substantially constant or may vary for different depths. The lateral summed number of dopants per unit area may be equal or proportional to a number of free charge carriers within a compensation region 103 or a drift region 101 to be compensated in a particular depth, for example.

The body region 104 of the transistor structure is arranged adjacent to a drift region 101 of the plurality of drift regions 101. For example, the body region 104 of the transistor structure may be located in the semiconductor substrate 102, substantially vertically adjacent to the drift region 101 in the semiconductor substrate 102.

A doping type of the body region 104 may be opposite to the doping type of the first doping region 106 and the drift region 101, for example. For example, the body region 104 may comprise the second conductivity type, for example. The body region 104 may have an average doping concentration of at least $1 \times 10^{17}$ dopant atoms per $cm^3$ (or e.g. between $1 \times 10^{17}$ dopant atoms per $cm^3$ and $1 \times 10^{18}$ dopant atoms per $cm^3$). The average doping concentration may be a measured number of dopant atoms (e.g. acceptor dopant atoms) per volume averaged over a region of interest of the body region, for example.

The body region 104 of the transistor structure (and the first doping region 106 of the transistor structure) may be located in a portion of the semiconductor substrate 102 that may be located laterally between a (first) gate trench structure and a further gate trench structure of a plurality of gate trench structures. For example, the body region 104 of the transistor structure and the first doping region 106 of the transistor structure may be located between a sidewall of the (first) gate trench structure and a sidewall of the further gate trench structure. The body region 104 of the transistor structure (and the first doping region 106 of the transistor structure) may be located in a self-aligned semiconductor substrate pillar structure spatially defined or formed in the semiconductor substrate as a result of the formation of the (first) gate trench structure and the further gate trench structure.

A lateral dimension of the portion of the semiconductor substrate 102 comprising the body region 104 of the transistor structure and the first doping region 106 of the transistor structure (e.g. a lateral dimension of the self-aligned semiconductor substrate pillar structure) may thus be defined by a width of the gate trench structures (e.g. the first gate trench structure and/or the second gate trench structure), for example. The portion of the semiconductor substrate 102 comprising the body region 104 of the transistor structure and the first doping region 106 of the transistor structure may have a lateral dimension smaller than a lateral dimension of the drift region 101 of the transistor structure in a direction orthogonal to a lateral extension of the gate 105 (e.g. in the same first lateral direction), for example. The portion of the semiconductor substrate 102 comprising the body region 104 of the transistor structure and the first doping region 106 of the transistor structure may have a lateral dimension of between 500 nm and 2 µm (or e.g. between 1 µm and 1.5 µm), for example.

The body region 104 of the transistor structure and the compensation region 103 of the (same) transistor structure may be separated within the semiconductor substrate 102 by at least one p-n junction. For example, the at least one p-n junction may be formed at a junction between the drift region 101 (e.g. having an n-type conductivity) of the transistor structure and the compensation region 103 (e.g. having a p-type conductivity) adjacent to the drift region 101 of the transistor structure. For example, the at least one p-n junction may be formed at least partially in the drift region 101 of the transistor structure and the compensation region 103 of the (same) transistor structure. Additionally, alternatively or optionally, the at least one p-n junction may be formed at a junction between the drift region 101 of the transistor structure and the adjacent body region 104 of the transistor structure. For example, the at least one p-n junction may be formed at least partially in the drift region 101 of the transistor structure and the directly adjacent body region 104 of the (same) transistor structure.

The gate 105 of the transistor structure may extend substantially vertically along the body region 104 of the transistor structure. For example, at least part of the gate 105 may be formed on at least one sidewall of the (first) gate trench structure located adjacent (e.g. directly adjacent) to the body region 104 of the transistor structure.

The gate 105 may control the vertical channel of charge carriers which may be formed at least partially in the body region. The gate 105 may control a vertical channel through the body region 104 between the first doping region 106 of the transistor structure and the drift region 101 of the transistor structure, for example. A direction of flow of charge carriers in the vertical conducting channel formed in the body region 104 may be in a substantially vertical direction, e.g. in a direction orthogonal or perpendicular to a front side surface of the semiconductor substrate 102 or to a back side surface of the semiconductor substrate 102, for example. For example, the flow of charge carriers in the vertical channel may be from a first (or front) side surface of the semiconductor substrate 102 to a second (or back) side surface of the semiconductor substrate 102, or vice versa.

The gate 105 may be part of a gate structure, which may include a gate oxide layer and a gate contact layer. At least part of the gate structure forming the gate 105 of the transistor structure may be located laterally between at least part of a first doping region contact structure in electrical connection with the first doping region 106 of the transistor structure and at least part of a compensation region contact structure in electrical connection with the compensation region 103 adjacent to the drift region 101 of the transistor structure. For example, the gate 105 of the transistor structure may be formed on a sidewall of the (first) gate trench structure located between the first doping region contact structure and the first compensation region contact structure.

The gate 105 may be one of a plurality of gates 105 of the semiconductor device 100. The plurality of gates 105 may be formed on the sidewalls of a plurality of gate trench structures. The plurality of gate trench structures may comprise (or hold) the gates 105 of the transistor structures of the vertical field effect transistor arrangement. For example, each gate 105 may be located within or in a gate trench structures. The plurality of gate trench structures may be formed in the semiconductor substrate 102 and each gate trench structure of the plurality of gate trench structures may be located adjacent to a body region 104 of the transistor structure. Each sidewall of the plurality of gate trench structures may be located adjacent (e.g. directly adjacent) to the body region 104 of the plurality of body regions 104 of the semiconductor device.

Additionally or optionally, each gate trench structure may be formed or located adjacent (e.g. directly adjacent) to a compensation region 103 of the plurality of compensation regions 103 of the semiconductor device. For example, a bottom of each gate trench structure may be formed directly on or directly adjacent to a compensation region 103 of the plurality of compensation regions 103. For example, a (or each) compensation region 103 of the plurality of compensation regions 103 of the semiconductor device 100 may extend from a bottom of the gate trench structure into the semiconductor substrate 102 in a substantially vertical direction.

The semiconductor device 100 may further include a plurality of compensation region contact structures. Each compensation region contact structure may be electrically connected to a compensation region 103, for example. The compensation region contact structure may include metal or electrically conductive material (e.g. copper, tungsten, aluminum or alloys of these materials, or polysilicon). The compensation region contact structure of the transistor structure may be formed in a compensation region contact trench structure located in proximity to a compensation region 103 adjacent to a drift region 101 of the transistor structure, for example.

The compensation region contact structure may be in contact with the compensation region within the gate trench structure, for example. For example, at least a part of the compensation region contact structure may be located within the gate trench structure adjacent to the body region 104 of the transistor structure. The compensation region contact trench structure may be formed above the compensation region and located at least partially in the gate trench structure. At least part of the compensation region contact trench structure may extend through a bottom of the gate trench structure into the compensation region 103, for example.

The compensation region contact structure may be laterally surrounded by at least part of the gate structure located within the gate trench structure. The compensation region contact structure may be separated or electrically insulated from other structures in the gate trench structure (e.g. the gate located in the gate trench structure) by electrically insulating material located in the compensation region contact trench structure. For example, the electrically insulating layer may be located on sidewalls of the compensation region contact trench structure), for example.

The semiconductor device 100 may further include a plurality of first doping region contact structures. The first doping region contact structure may be electrically connected to a first doping region 106, for example. The first doping region contact structure may include metal or electrically conductive material (e.g. copper, tungsten, aluminum or alloys of these materials or polysilicon). The first doping region contact structure may be formed in a first doping region contact trench structure located in proximity to the first doping region 103, for example. The first doping region contact trench structure may extend into the portion of the semiconductor substrate 102 comprising the first doping region 106 of the transistor structure, for example. Thus, a part of the first doping region contact structure may be laterally surrounded by the first doping region, for example. The first doping region contact structure may be separated or electrically insulated from other structures of the semiconductor device 100 (e.g. from the gate structure) by electrically insulating material located in the first doping region contact trench structure. For example, an electrically insulating layer located on sidewalls of the first doping region contact trench structure may electrically insulate the first doping region contact structure from the gate structure or the gate 105 of the gate structure, for example.

The first doping region contact structure may include an interface layer. The interface layer may be located at an interface between the first doping region contact structure and the body region 104, for example. The material of the interface layer may be titanium silicide (Ti—Si), for example. The body region 104 may further include a highly doped region (e.g. a p+ doped region) located adjacent between (e.g. at an interface between) the body region 104 and the first doping region contact structure. The highly doped region of the body region may have an average doping concentration of at least $1 \times 10^{18}$ dopant atoms per $cm^3$ (or e.g. between $1 \times 10^{18}$ dopant atoms per $cm^3$ and $1 \times 10^{19}$ dopant atoms per $cm^3$). The highly doped region of the body region 104 may be located adjacent to the interface layer of the first doping region contact structure, for example. The material of the interface layer of the first doping region contact structure and a doping concentration of the highly doped region of the body region may be chosen to control or vary a contact resistance between the first doping region contact structure and the body region of the transistor structure.

The compensation region contact structure may include an interface layer (e.g. a further interface layer). The (further) interface layer may be located at an interface between the compensation region contact structure and the compensation region, for example. The material of the (further) interface layer may be titanium silicide (Ti—Si), for example. The compensation region may further include a highly doped region (e.g. a p+ doped region) located at an interface between the compensation region contact structure and the compensation region. The highly doped region of the compensation region may be located adjacent to the (further) interface layer of the compensation region contact structure, for example. The material of the interface layer of the compensation region contact structure and a doping concentration of the highly doped region of the compensation region may be chosen to control or vary a contact resistance between the compensation region contact structure and the compensation region of the transistor structure.

A contact resistance between the first doping region contact structure and the body region of the transistor structure may be different from a contact resistance between the compensation region contact structure and the compensation region, for example. For example, the contact resistance between the first doping region contact structure and the body region of the transistor structure may differ from the contact resistance between the compensation region contact structure and the compensation region by more than 10% (or more than 15%).

The material of the interface layer of the compensation region contact structure may be different from the material of the interface layer of the first doping region contact structure so that the contact resistance between the first doping region contact structure and the body region of the transistor structure is different from a contact resistance between the compensation region contact structure and the compensation region. Additionally, optionally or alternatively, the doping concentration of the highly doped region of the compensation region may be different from the doping concentration of the highly doped region of the body region so that the contact resistance between the first doping region contact structure and the body region of the transistor structure is different from a contact resistance between the compensation region contact structure and the compensation region, for example.

The semiconductor device 100 may further include an electrically conductive contact structure forming a short circuit connection between a part of the first doping region 106 of the transistor structure and a part of the body region 104 of the transistor structure. For example, the electrically conductive contact structure may form a source-body short circuit connection (e.g. a source-body short) between a part of the first doping region 106 of the transistor structure and a part of the body region 104 of the transistor structure. The electrically conductive contact structure may be in contact with the first doping region 106 of the transistor structure and the body region 104 of the transistor structure within a contact trench.

The electrically conductive contact structure may be a part of the first doping region contact structure. For example, the electrically conductive contact structure forming the source-body short may be formed in a part of the electrically conductive contact structure along a lateral length of first doping region contact structure. Other parts of the first doping region contact structure may contact the first doping region without providing a source-body short, for example.

The semiconductor substrate 102 may be part of a semiconductor wafer or a semiconductor die. The semiconductor substrate 102 of the semiconductor device 100 may be a silicon substrate, a silicon carbide substrate, a gallium arsenide substrate or a gallium nitride substrate, for example. A surface (e.g. front side surface or main surface) of the semiconductor substrate may be a semiconductor surface of the semiconductor substrate towards metal layers, insulation layers or passivation layers on top of the semiconductor surface. In comparison to a basically vertical edge (e.g. resulting from separating the semiconductor substrate from others) of the semiconductor substrate, the surface of the semiconductor substrate may be a basically horizontal surface extending laterally. The surface of the semiconductor substrate may be a basically even plane (e.g. neglecting unevenness of the semiconductor structure due to the manufacturing process or trenches). In other words, the surface of the semiconductor substrate may be the interface between the semiconductor material and an insulation layer, metal layer or passivation layer on top of the semiconductor substrate. For example, a lateral direction or lateral expansion may be a direction or orientation substantially in parallel to the front side surface or back side surface and a vertical direction or vertical expansion may be a direction or orientation substantially orthogonal or perpendicular to the front side surface or back side surface.

The vertical field effect transistor arrangement of the semiconductor device may include at least one transistor structure (or e.g. one or more transistor structures). Each transistor structure may include (or may be) a vertical field effect transistor (FET), for example. The vertical field effect transistor arrangement may comprise a plurality of cells or repeated structures (e.g. transistor structures, field effect transistor cells, metal oxide semiconductor transistor cells or insulated gate bipolar transistor cells) within the cell field. Each FET may include at least the (first) doping region 106 of the first conductivity type, the body region 104 of the second conductivity type and a further (or second) doping region of the first conductivity type, for example.

The transistor structures of the vertical FET arrangement may include or may be metal oxide semiconductor field effect transistors (MOSFET), for example. In a MOSFET, the (first) doping region may be a (first) source/drain region and the further (second) doping region may be a (second) source/drain region, for example. Each vertical FET may include the body region 104 arranged between a first doping region 106 and the second doping region. The second doping region may comprise a portion represented by a drift region of the plurality of drift regions and the highly doped (second) source/drain region located at the back side of the semiconductor substrate. For example, a field effect transistor cell may comprise a source region, a body region, a drain region (e.g. shared with other cells) and a gate for controlling a channel through the body region.

Optionally, the transistor structure may include or may be a part of an insulated gate bipolar transistor (IGBT) structure, for example. In an IGBT structure, the (first) doping region 106 may be a (first) emitter region and the drift region 101 may be a further (second) doping region of the IGBT, for example. An IGBT may further include a third doping region (of the second conductivity type) which may be a collector region, for example. The third doping region may be located in the semiconductor substrate 102, between the drift region 101 and a back side metallization contact form on the second side surface of the semiconductor substrate 102, for example.

The embodiments described herein may relate to concepts for applying trench concepts in a sub-structure of a semiconductor substrate 102. The processes for realizing the trench concepts may be carried out by a forming p columns (by a Si etch to form trenches) in an epitaxially grown n-substrate. This may be followed by epitaxial growth of p-type doped Si in the trenches. The remaining n-type doped semiconductor substrate may form n columns. An SiO$_2$ hard mask may be used during etching of gate trenches to produce a self-aligned transistor structure. Such an integrations concept may be used for forming a compensation device (e.g. CoolMOS) superstructure for CoolMOS chips, which may be formed by multiple epitaxial growth or implant substructures and a planar superstructure.

The semiconductor device 100 may be a power semiconductor device comprising a breakdown voltage or blocking voltage of more than more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V or 2000V), for example.

The embodiments described herein may relate to a self-aligned superstructure using trench concepts and vertical transistors. The self-aligned superstructure may be self-aligned to n type doped columns and p-type doped columns, for example. The transistor structure may be self-aligned with the sub-structure, which may increase the process reliability and allow for increased shrinkage of CoolMOS cells (e.g. compensation devices), without using additional lithography and therefore reducing expenses. Through the self-alignment of the transistor structure, lithography processes (e.g. etching of the gate structures) may be eliminated or reduced, for example. Depending on the thermal budget and the integrations scheme, the transistor structure body region (e.g. p-type doped) and a source region of the transistor structure (n-type doped) may be subsequently implanted at (or on) the n-type epitaxial region. This may simplify the integrations schemes, for example.

The semiconductor device 100 may include vertical transistors or vertical transistor structures, whose channel length may be selected independent from the cell width (pitch). For example, the channel length of the body region 104 (or gate length) may be greater than or equal to 1 µm (or e.g. between 500 nm to 1.5 µm). This may make further shrinkage of the CoolMOS transistor structures (e.g. compensation devices) possible, without sacrificing the advantages from long Channel FETs. The cost of the semiconductor devices (using the cell concept) may be less than planar structures, for example. The cell concept may also be integrated with other trench substructure concepts.

The semiconductor device 100 may include a plurality of transistor cell regions. Each transistor cell region may include a transistor structure including (or comprising) the first doping region 106 of the transistor structure, the body region 104 of the transistor structure, and the drift region 101 of the transistor structure. The transistor cell region may further include at least one compensation region 103 located directly adjacent to the drift region 101 of the transistor structure. The pitch of the transistor cell may lie between 1 µm and 20 µm (or e.g. between 2 µm and 10 µm, or e.g. about 4 µm), for example. The pitch of the transistor cell may be a width of the transistor cell measured in at least one lateral direction (e.g. in the first lateral direction), for example.

The semiconductor device 100 described herein may be related to or based on an integrations concept, by which the gate structures are not arranged horizontally but vertically, for example. This may make it possible to adjust a channel length independent of the structure width of the transistor, for example. The concept may be used in new IGBT generations applying MOS transistor structures, for example. The p-type doped compensation region may be contacted by a compensation region contact structure arranged at or over the p-type column, and contacted separately from the p-type doped (source) regions and the body region in the transistor structure. This may make it possible to optimize the separation of the contacts from each other, instead of contacting of the source region, the transistor body region and the p-column compensation region by a single contact structure in a transistor planar arrangement, for example.

Figure 2:
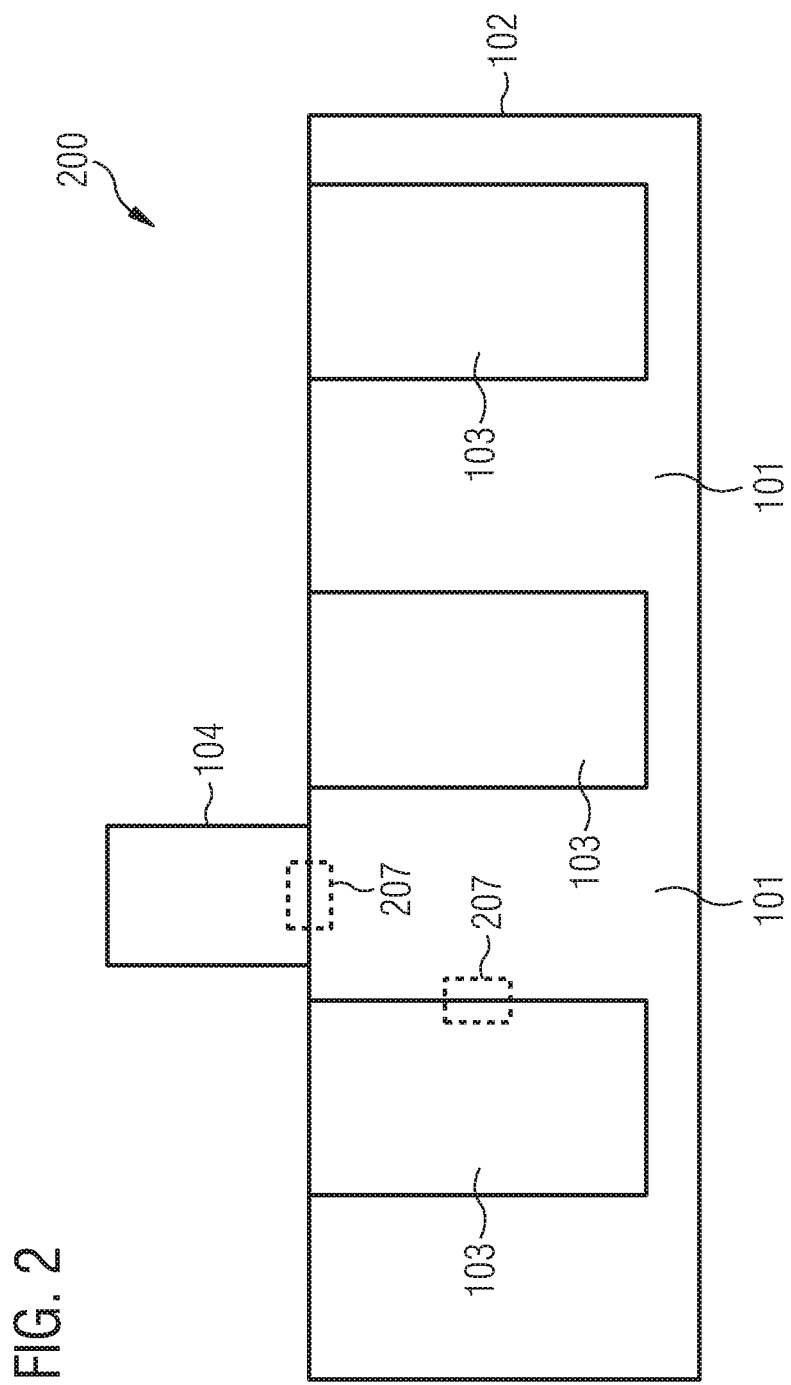
FIG. 2 shows a schematic illustration of a semiconductor device having at least one p-n junction in the semiconductor substrate.

FIG. 2 shows a schematic illustration of a semiconductor device 200 according to an embodiment.

The semiconductor device 200 comprises a plurality of drift regions 101 of a vertical field effect transistor arrangement arranged in a semiconductor substrate 102. The plurality of drift regions comprises a first conductivity type.

The semiconductor device 200 comprises a plurality of compensation regions 103 arranged in the semiconductor substrate 102. The plurality of compensation regions 103 comprises a second conductivity type.

Each drift region 101 of the plurality of drift regions 101 is arranged adjacent to at least one compensation region 103 of the plurality of compensation regions 103.

The semiconductor device 200 comprises a body region 104 of a transistor structure of the vertical field effect transistor arrangement arranged adjacent to a drift region 101 of the plurality of drift regions 101.

The compensation regions 103 and the body region 104 of the transistor structure are separated within the semiconductor substrate 102 by at least one p-n junction 207.

Due to the compensation region 103 and the body region 104 of the transistor structure being separated within the semiconductor substrate 102 by at least one p-n junction 207, a contact to the compensation region 103 may be controlled independently from a contact to other doping regions of the transistor structure, for example. For example, a contact resist to the compensation region 103 may be varied independently from a contact to a source region and/or a body region 104 of the transistor structure, for example. Furthermore, the reliability and/or durability of the semiconductor device 100 may be improved due the efficient removal of charge carriers from the drift regions 101 by the adjacent compensation regions 103.

The semiconductor device 200 may be similar to the semiconductor device 100 described in connection with FIG. 1, for example.

The body region 104 of the transistor structure and the compensation regions 103 of the (same) transistor structure may be separated within the semiconductor substrate 102 by at least one p-n junction. For example, the at least one p-n junction may be formed at a junction between the drift region 101 (e.g. having an n-type conductivity) of the transistor structure and the compensation region 103 (e.g. having a p-type conductivity) adjacent to the drift region 101 of the transistor structure. For example, the at least one p-n junction may be formed at least partially in the drift region 101 of the transistor structure and the compensation region 103 of the (same) transistor structure. Additionally, alternatively or optionally, the at least one p-n junction may be formed at a junction between the drift region 101 of the transistor structure and the adjacent body region 104 of the transistor structure. For example, the at least one p-n junction may be formed at least partially in the drift region 101 of the transistor structure and the directly adjacent body region 104 of the (same) transistor structure.

Additionally or optionally, the body region (104) of the transistor structure may be separated from each compensation region 103 of the plurality of compensation regions 103 (e.g. each compensation region 103 of the vertical field effect transistor arrangement) by at least one p-n junction.

More details and aspects are mentioned in connection with the embodiments described above or below. The embodiments shown in FIG. 2 may comprise one or more optional additional features corresponding to one or more aspects mentioned in connection with the proposed concept or one or more embodiments described above (e.g. FIG. 1) or below (e.g. FIGS. 3 to 7).

Figure 3:
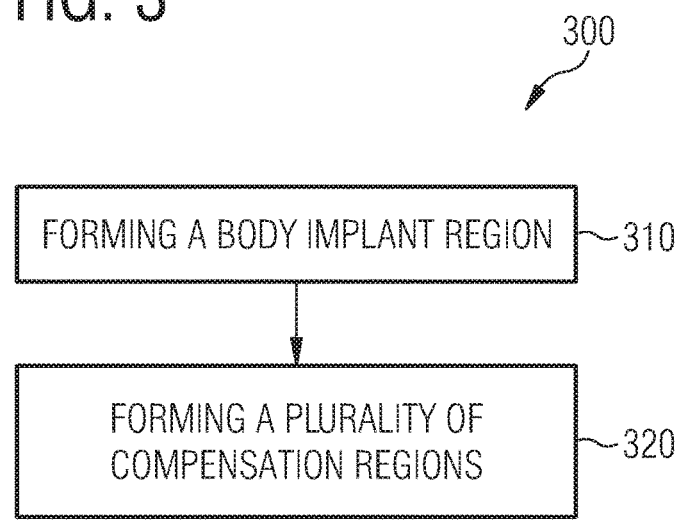
FIG. 3 shows a flow chart of a method for forming a semiconductor device.

FIG. 3 shows a flow chart of a method 300 for forming a semiconductor device according to an embodiment.

The method 300 comprises forming a body implant region of a vertical field effect transistor arrangement.

The method 300 further comprises forming 320 a plurality of compensation regions in the semiconductor substrate after forming the body implant region of the vertical field effect transistor arrangement.

Due to the forming 320 of the plurality of compensation regions after forming the body implant region, a more reliable semiconductor device may be obtained. For example, the body implant region forming a body region of a transistor structure may be self-aligned with the compensation region, which may lead to additional lithography processes and hence processing costs being reduced, for example.

The body implant region may be formed by incorporating dopant atoms into selected regions of the semiconductor substrate, for example. The dopant atoms may be incorporated (or implanted) into the semiconductor substrate from a front side surface of the semiconductor substrate, for example.

Forming the plurality of compensation regions in the semiconductor substrate may include forming a plurality of compensation trench structures in the semiconductor substrate, and growing epitaxial semiconductor material in the plurality of compensation trench structure to form the plurality of compensation regions. The plurality of compensation regions may be formed in a plurality of compensation trench structures formed in the semiconductor substrate. The compensation regions 103 may be formed by growing epitaxial semiconductor material (e.g. p-doped epitaxial silicon) in the plurality of compensation trench structures to form the plurality of compensation regions, for example.

The method 300 may further include forming of a first doping implant region of the vertical field effect transistor arrangement in the semiconductor substrate after forming the body implant region and before forming the plurality of compensation regions in the semiconductor substrate.

The method 300 may further include performing an out-diffusion of the body implant region to form a body region of the vertical field effect transistor. The first doping region may also be formed from the out-diffusion of the first doping implant region. The out-diffusion of the implant regions may be carried out after forming the body implant region and the first doping implant region in the semiconductor substrate, for example.

The method 300 may further include forming a plurality of compensation trench structures in the semiconductor substrate and at least partially filling the compensation trench structures with material for forming compensation region contact structures. The forming of the plurality of compensation trench structures may take place before the out-diffusion of the body implant region to form the body region or implant regions to form the body region and before the out-diffusion of the first doping implant region to form the first doping implant region, for example. Alternatively or optionally, the plurality of compensation trench structures may be formed after the body region and the first doping implant region are formed.

The method 300 may further include forming a plurality of gate trench structures based on portion of the compensation trench structures remaining unfilled after forming the plurality of compensation regions in the plurality of compensation trench structures. For example, the plurality of gate trench structures may be formed by etching (e.g. wet etching) the sidewalls of the unfilled portions of the compensation trench structures so that each gate trench structure has a lateral dimension larger than lateral dimension of compensation trench structure. Forming the plurality of gate trench structures may lead to a plurality of self-aligned semiconductor substrate pillar structures being formed. Each self-aligned semiconductor substrate pillar structure may include a body region of at least one transistor structure and the first doping region of the at least one transistor structure, for example.

The method 300 may further include forming a plurality of gates of the vertical field effect transistor arrangement at sidewalls of the plurality of gate trench structures. The method may include forming the gate structure by forming a gate oxide layer on the first side surface of the semiconductor substrate and a gate contact layer on the gate oxide layer. At least part of the gate structure may be formed (directly) on sidewalls of the plurality of gate trench structures and on sidewalls of the self-aligned semiconductor substrate pillar structure. The part of the gate formed on the body region located in the self-aligned semiconductor substrate pillar structure may control a vertical channel between the first doping region and the drift region.

The method 300 may include forming a plurality of compensation region contact trench structures and a plurality of first doping region contact trench structures. The method may include forming the plurality of compensation region contact trench structures so that each compensation region contact trench structure of the plurality of compensation region contact trench structures is formed on a compensation region of the plurality of compensation regions. The method 300 may further include forming the plurality of first doping region contact trench structures so that each first doping region contact trench structure of the plurality of first doping region contact trench structures is formed on the first doping region, for example.

More details and aspects are mentioned in connection with the embodiments described above or below. The embodiments shown in FIG. 3 may comprise one or more optional additional features corresponding to one or more aspects mentioned in connection with the proposed concept or one or more embodiments described above (e.g. FIGS. 1 to 2) or below (e.g. FIGS. 4 to 7).

FIGS. 4A to 4K show schematic illustrations of a method for forming a semiconductor device according to an embodiment.

The method may be similar to the method 300 described in connection with FIG. 3, for example.

Figure 4A:
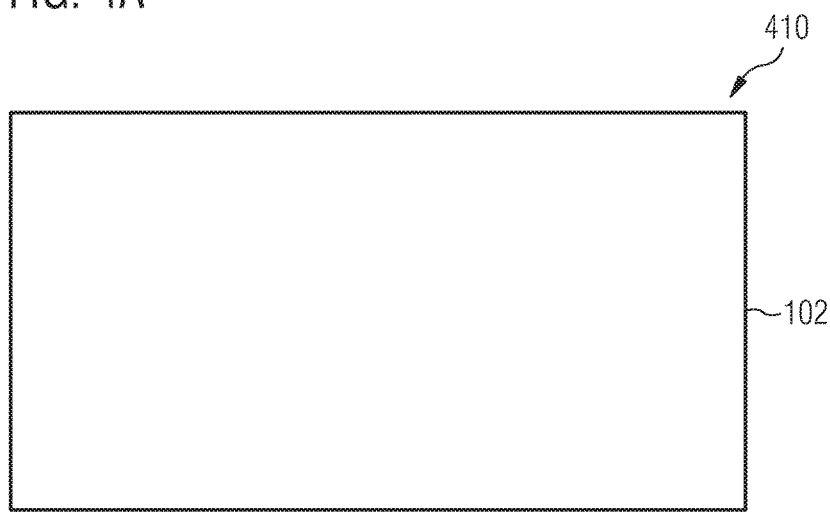

FIG. 4A shows a schematic illustration 410 of a semiconductor substrate 102 formed by the epitaxial growth of silicon, for example. The method may include epitaxially growing a semiconductor substrate 102 to form a crystalline doped silicon wafer of the first conductivity type (e.g. an n-type doped crystalline silicon wafer), for example.

Figure 4B:
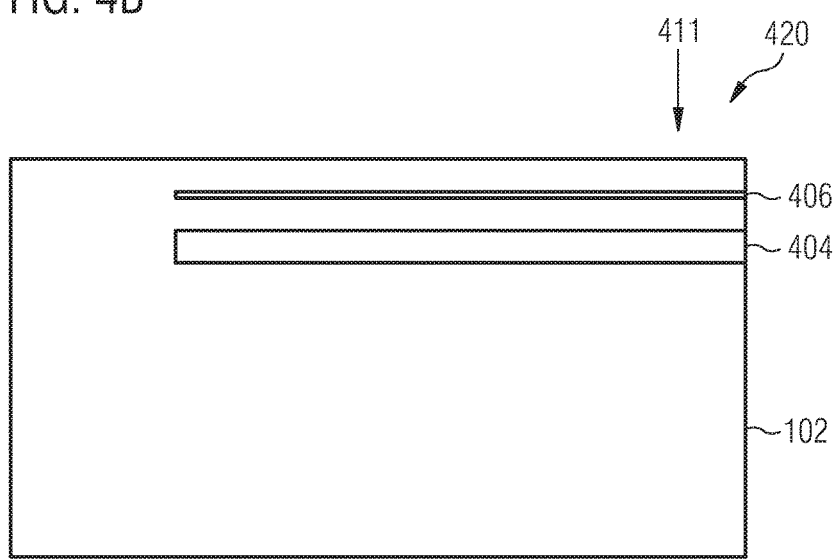

FIG. 4B shows a schematic illustration 420 of the forming of a body implant region 404 of a vertical field effect transistor arrangement in the semiconductor substrate 102, and the forming of a first doping implant region 406 of the vertical field effect transistor arrangement in the semiconductor substrate 102.

The method may include forming and patterning a photolithography mask in a lithographic process to form the body implant region 404 and the first doping implant region 406 in selected regions of the semiconductor substrate 102. The method may include forming the body implant region 404 by implanting doping atoms of the second dopant type (e.g. p-type doping atoms) in selected regions of the semiconductor substrate 102. The method may further include forming the first doping implant region 406 (e.g. a source implant region) by implanting doping atoms of a first dopant type (e.g. n-type doping atoms) in the semiconductor substrate 102. The body implant region 404 may be formed deeper into the semiconductor substrate 102 from the first side surface 411 in a substantially vertical direction than the first doping implant region 406, for example. For example, the body implant region 404 may be formed at a vertical depth of between 300 nm and 1 µm from the first side surface 411 of the semiconductor substrate, for example. For example, the first doping implant region 406 may be formed at a vertical depth of between 10 nm and 500 nm from the first side surface 411 of the semiconductor substrate, for example.

FIG. 4C shows a schematic illustration 430 of the forming of a plurality of compensation trench structures 408 in the semiconductor substrate 102.

The method may include forming a hard mask layer 409 over the first (or front) side surface 411 of the semiconductor substrate 102. The hard mask layer 409 may be a silicon oxide (e.g. silicon dioxide) layer, for example. Portions of the hard mask layer 409 may be removed (e.g. by plasma or dry etching) from the first surface of the semiconductor substrate 102 to expose regions of the semiconductor substrate 102 where the plurality of compensation trench structures 408 are to be formed, for example. The plurality of compensation trench structures 408 may be formed by etching the exposed regions of the semiconductor substrate 102, for example. Regions of the semiconductor substrate 102 which are covered by the hard mask layer 409 may be protected from the etching, for example. For example, FIG. 4C shows the semiconductor substrate 102 (wafer) after the compensation trench etching with the remaining oxide (e.g. with remaining portions of the hard mask layer 409) on the first (or front) side surface 411 of the semiconductor substrate 102.

The plurality of compensation trench structures 408 may extend from the front side surface 411 of the semiconductor substrate 102 to a depth (in a substantially vertical direction, dz) of more than 10 µm (or more than 20 µm or more than 50 µm) into the semiconductor substrate 102. Additionally or optionally, a lateral distance, c, (in a first lateral direction, dx) between neighboring compensation trench structures 408 of the plurality of compensation trench structures 408 may be less than 20 µm (or less than 10 µm or less than 5 µm, or e.g. about 4 µm), for example.

The plurality of compensation trench structures 408 may be formed in portions of the semiconductor substrate 102 comprising the body implant region 404 and the first doping implant region 406 of the vertical field effect transistor arrangement, for example. For example, the plurality of compensation trench structures 408 may be formed by etching through the body implant region 404 and the first doping implant region 406 of the vertical field effect transistor arrangement. For example, remaining portions of the body implant region 404 and the remaining portions of the first doping implant region 406 in the semiconductor substrate 102 may be located adjacent to the plurality of compensation trench structures 408. For example, the remaining portions of the body implant region 404 and the remaining portions of the first doping implant region 406 in the semiconductor substrate 102 may be located between adjacent compensation trench structures 408 of the plurality of compensation trench structures 408.

FIG. 4D shows a schematic illustration 440 of the forming of a plurality of compensation regions 103 in the semiconductor substrate 102.

The method may include forming the plurality of compensation regions 103 in the plurality of compensation trench structures 408 after forming the plurality of compensation trench structures 408 in the semiconductor substrate 102. The compensation regions 103 may be formed by growing epitaxial semiconductor material of the second conductivity type (e.g. p-doped crystalline epitaxial silicon) in the plurality of compensation trench structures 408 to form the plurality of compensation regions 103, for example. The epitaxial semiconductor material may be grown in the compensation trench structures 408 adjacent to portions of the semiconductor substrate 102 forming the drift regions 101 of the vertical field effect transistor arrangement, for example.

Additionally or optionally, the method may further include carrying out chemical mechanical polishing (CMP) on the epitaxially grown semiconductor material (silicon) forming the compensation regions 103 with a stop on the oxide (hard mask layer 409). For example, the epitaxially grown semiconductor material forming the compensation regions 103 may be smoothened using CMP, with the CMP being selective towards (e.g. does not etch) the hard mask layer 409.

Additionally or optionally, the method may further include carrying out a dry etch (e.g. an anisotropic etch) of the epitaxially grown semiconductor material (silicon) forming the compensation regions 103, for example. The same hard mask layer 409 used for the forming (e.g. etching) of the plurality of compensation trench structures 408 in the semiconductor substrate 102 may be used for protecting regions of the semiconductor substrate 102 covered by the hard mask layer 409 from the etching of the epitaxially grown semiconductor material, for example.

The chemical mechanical polishing and/or the dry etch process may be carried out so that the compensation regions 103 are formed deeper (or lower) in the semiconductor substrate 102 than the body implant region 404 (or e.g. so that the compensations regions 103 do not overlap the body implant region 404 of the first doping implant region 406 in the first lateral direction), for example.

Portions of the compensation trench structures 408 may remain unfilled after forming the plurality of compensation regions 103 in the plurality of compensation trench structures 408 (e.g. after CMP and after etching), for example. The unfilled portions of the compensation trench structures 408 may be adjacent to the body implant region 404 and the first doping implant region 406 located in the semiconductor substrate 102, for example.

Figure 4E:
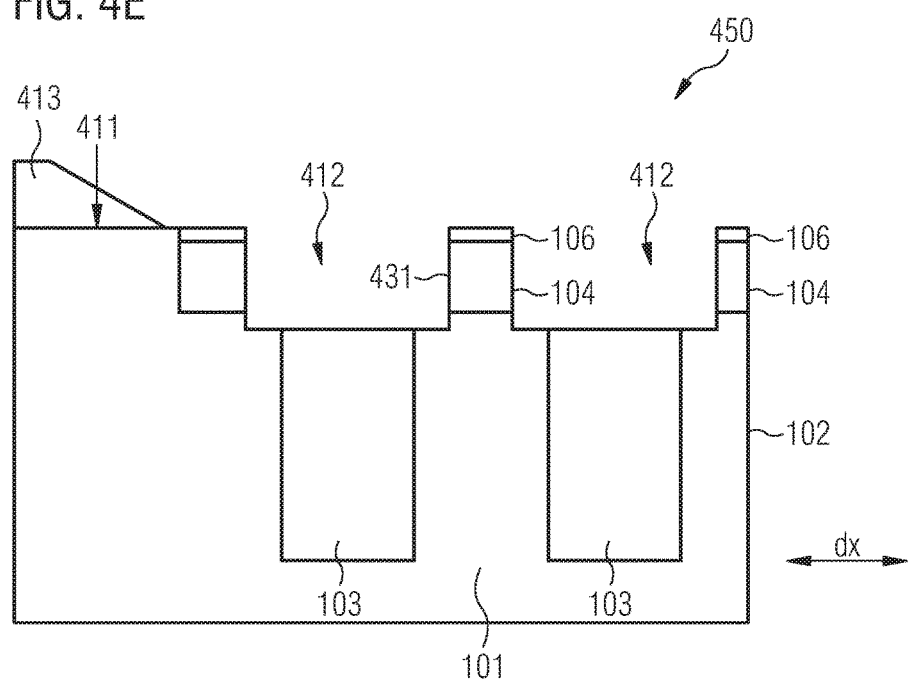

FIG. 4E shows a schematic illustration 450 of the forming of a plurality of gate trench structures 412 in the semiconductor substrate 102, for example.

The method may include removing the remaining portions of the hard mask layer 409. The remaining portions of the hard mask layer 409 may be removed by a silicon dioxide ($SiO_2$) strip process, for example.

The method may further include performing a dopant out-diffusion of the body implant region 404 and the first doping implant region 406 to form the body regions 104 of transistor structures of the vertical FET arrangement and the first doping regions 106 of transistor structures of the vertical FET arrangement, respectively, for example. The dopant out-diffusion may be carried out after removing the remaining portions of the hard mask layer 409, for example. The body implant region 404 and the first doping implant region 406 formed by the out-diffusion of dopants may thus be directly adjacent to each other, for example.

The method may further include performing thermal oxidation of regions of the semiconductor substrate exposed at the first side surface 411 of the semiconductor substrate 102 to form an insulation (silicon dioxide) layer 413, for example. The insulation layer 413 may electrically insulate the semiconductor substrate from other metal layers formed on the first side surface of the semiconductor substrate 102. The thermal oxidation to form the insulating layer 413 and the dopant out-diffusion of the body implant region and the first doping implant region 406 may be carried out simultaneously using a common heating process, for example. The thermal oxidation may consume about 500 nm of Si semiconductor substrate, for example.

The method may further include forming the plurality of gate trench structures 412 in selected regions of the semiconductor substrate 102 using lithography after performing the out-diffusion of the body implant region 406 and the first doping implant region 406, for example. For example, the plurality of gate trench structures 412 may be formed based on portions of the compensation trench structures remaining unfilled after forming the plurality of compensation regions 103 in the plurality of compensation trench structures. For example, the plurality of gate trench structures 412 may be formed by etching (e.g. wet etching) the sidewalls of the unfilled portions of the compensation trench structures so that each gate trench structure 412 has a lateral dimension larger than lateral dimension of the compensation trench structure.

Each gate trench structure 412 may have a larger lateral width (in the first lateral direction) than a lateral width of the compensation region 103 (e.g. between 1 μm and 5 μm or between 2 μm and 3 μm) on which it is formed. For example, each gate trench structure 412 may have a larger lateral width of between 5% and 30% larger than the lateral width of each compensation region 103. Each gate trench structure may be located directly adjacent to a compensation region 103 of the plurality of compensation regions 103, for example. For example, the compensation regions 103 may extend from bottom of the gate trench structures 412 into the semiconductor substrate 102.

The method may include forming the plurality of gate trench structures 412 so that the sidewalls of the gate trench structures 412 are located laterally adjacent to the body regions 104 and the first doping regions 106 of the vertical FET arrangement (e.g. so that at least one sidewall of each gate trench structure 412 is located laterally adjacent to a body region 104 and a first doping regions 106 of a transistor structure), for example. For example, the plurality of gate trench structures 412 may be formed so that a plurality of self-aligned semiconductor substrate pillar structures 431 are formed adjacent to the plurality of gate trench structures. Each self-aligned semiconductor substrate pillar structure 431 of the plurality of self-aligned semiconductor substrate pillar structures 431 may be located between neighboring (or consecutive) gate trench structures 412. Each self-aligned semiconductor substrate pillar structure 431 of the plurality of self-aligned semiconductor substrate pillar structures 431 may include a body region 104 of at least one transistor structure and the first doping region 106 of the at least one transistor structure, for example. Each self-aligned semiconductor substrate pillar structures 431 of the plurality of self-aligned semiconductor substrate pillar structures 431 may be located on a drift region 101 of the plurality of drift regions 101, for example.

Figure 4F:
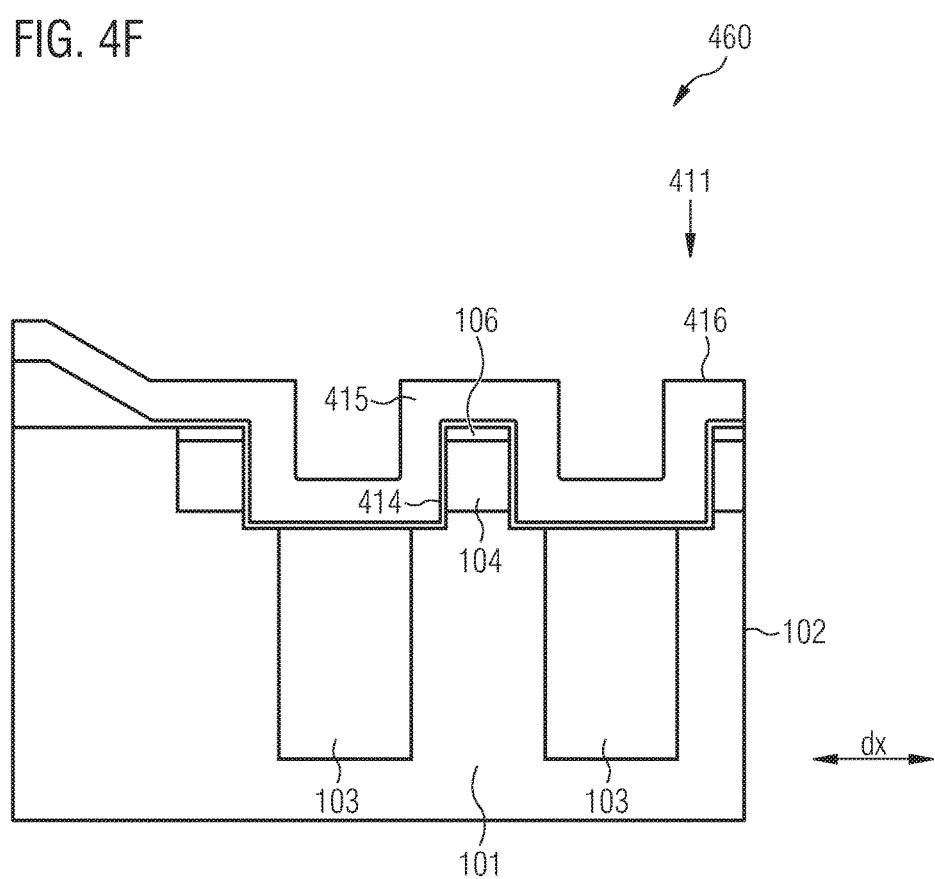

FIG. 4F shows a schematic illustration 460 of the forming of a gate structure 416 on the semiconductor substrate 102.

The method may include forming the gate structure 416 by forming a conformal gate oxide layer 414 (e.g. by gate oxidation) on the first side surface of the semiconductor substrate 102 and forming a conformal gate contact layer 415 on the gate oxide layer 414. The gate structure 416 may be formed after forming the gate trench structures 412, for example. The gate structure 416 may be formed on (e.g. may cover) the trench structures or pillar structures formed at the first side surface 411 of the semiconductor substrate 102, for example. At least part of the gate structure 416 may be formed (directly) on sidewalls of the plurality of gate trench structures 412, (directly) on the bottom of the plurality of gate trench structures 412 and on the first doping regions 106 of the vertical field effect transistor arrangement, for example. The gate contact layer 415 may be a polysilicon or a tungsten silicide layer, for example. The gate contact layer 415 may have a (minimum) thickness of greater than 200 nm, for example. The thickness of the gate contact layer 415 may range from between 200 nm and 600 nm (or e.g. between 200 nm and 400 nm), for example.

Figure 4G:
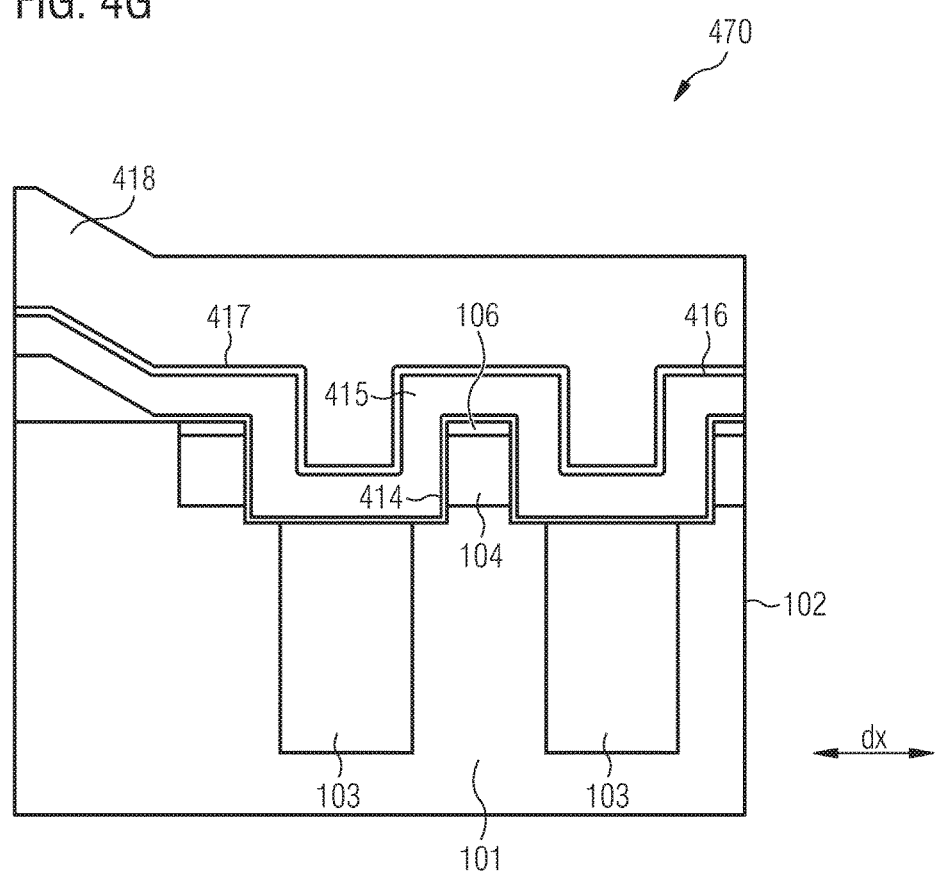

FIG. 4G shows a schematic illustration 470 of the forming of an electrically insulating liner layer 417 and an electrically insulating filler material 418 on the gate structure 416.

The method may optionally include forming the electrically insulating liner layer 417 conformally on the gate contact layer 415 of the gate structure 416 after forming the gate structure 416, for example. The electrically insulating liner layer 417 may be a Tetraethyl orthosilicate (TEOS) layer (or e.g. an oxide layer, or e.g. a silicon dioxide layer), for example. The electrically insulating liner layer 417 may have a thickness of less than 500 nm (e.g. about 200 nm), for example.

The method may further include forming the electrically insulating filler material 418 on the electrically insulating liner layer 417 or directly on the gate structure 416 (if the electrically insulating liner layer 417 is omitted), for example. The electrically insulating filler material 418 may be borophosphosilicate glass (BPSG) or silicon dioxide, for example. The electrically insulating filler material 418 may be formed by depositing and reflowing BPSG on the electrically insulating liner layer 417, for example. The electrically insulating filler material 418 may have a thickness of more than 1000 nm (or e.g. more than 1500 nm or e.g. about 1700 nm), for example.

Figure 4H:
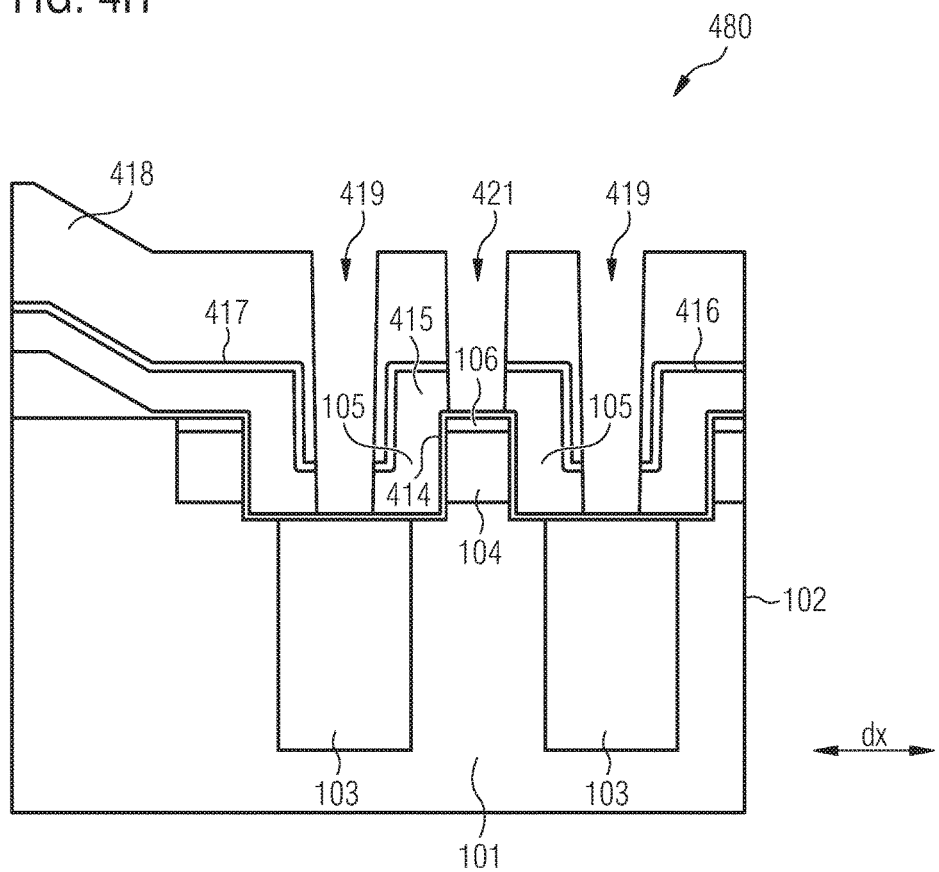
Figure 4I:
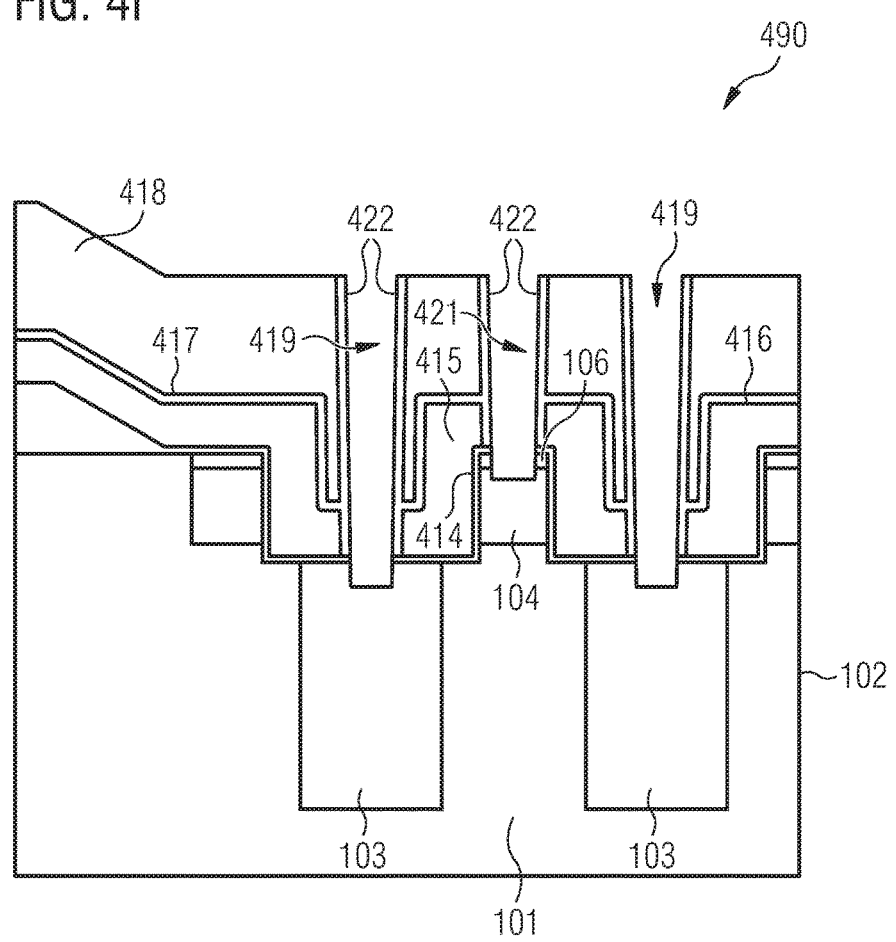

FIGS. 4H and 4I show schematic illustrations 480, 490 of the forming of a plurality of compensation region contact trench structures 419 and a plurality of first doping region contact trench structures 421, for example.

The method may include forming the plurality of compensation region contact trench structures 419 and the plurality of first doping region contact trench structures 421 after forming the electrically insulating liner layer 417 and the electrically insulating filler material 418, for example. The method may include forming the plurality of compensation region contact trench structures 419 and the plurality of first doping region contact trench structures 421 simultaneously in selected regions using lithography.

The plurality of compensation region contact trench structures 419 and the plurality of first doping region contact trench structures 421 may be formed by etching through the electrically insulating filler material 418, the electrically insulating liner layer 417, the gate contact layer 415, and the gate oxide layer 414, for example. For example, the plurality of compensation region contact trench structures 419 and the plurality of first doping region contact trench structures 421 may be formed by removing parts of the electrically insulating filler material 418, the electrically insulating liner layer 417, the gate contact layer 415, and the gate oxide layer 414 in selected regions using lithography, for example.

Using lithography, the plurality of compensation region contact trench structures 419 may be formed on the plurality of compensation regions 103 and the plurality of first doping region contact trench structures 421 may be formed on the first doping region 106, for example. For example, each compensation region contact trench structure 419 of the plurality of compensation region contact trench structures 419 may be formed on a compensation region 103 of the plurality of compensation regions 103. Additionally or optionally, each compensation region contact trench structure 419 of the plurality of compensation region contact trench structures 419 may be at least partially formed in a gate trench structure of the plurality of gate trench structures. For example, each first doping region contact trench structure 421 of the plurality of first doping region contact trench structures 421 may be formed on the first doping region 106.

The trench structures 419, 421 may be formed by carrying out an oxide etching process for etching the electrically insulating filler material 418 (comprising BPSG) and/or the electrically insulating liner layer 417 (comprising TEOS or $SiO_2$). The oxide etching process may be selective towards silicon or polysilicon (comprised in the gate contact layer 415), for example. Additionally, a silicon etching process may be carried out for etching the silicon or polysilicon (comprised in the gate contact layer 415), which may be selective towards silicon dioxide (comprised in the gate oxide layer 414), for example. An etching process for etching a targeted material and being selective towards a non-target material may mean that an etchant used in the etching process may etch the target material at an etch rate of more than 10 times (or e.g. more than 50 times or e.g. more than 100 times) faster than the non-target material, for example.

The plurality of compensation region contact trench structures 419 and the plurality of first doping region contact trench structures 421 may have a lateral dimension of between 500 nm and 1 µm (or e.g. between 600 nm and 900 nm, or e.g. about 800 nm), for example. For example, the lateral dimension may be a distance between the vertical sidewalls of the trench structures 419, 421 in the first lateral direction dx, for example. Optionally, the lateral dimension may be a distance between the vertical sidewalls of the trench structures 419, 421 in a direction along (or parallel to) a main surface of the semiconductor substrate 102.

Due to the forming of the plurality of compensation region contact trench structures 419 and the plurality of first doping region contact trench structures 421 by removing (at least) the gate contact layer 415, and the gate oxide layer 414 in selected regions, a plurality of gates 105 may be formed based on parts of the remaining gate structure 416 (which are not removed), for example.

The plurality of gates 105 comprising the (remaining) gate contact layer 415 located on the (remaining) gate oxide layer 414 may be located at the sidewalls of the plurality of gate trench structures. Each gate 105 of the plurality of gates 105 may be located between a compensation region contact trench structure 419 of the plurality of compensation region contact trench structures 419 and a first doping region contact trench structure 421 of the plurality of first doping region contact trench structures 421, for example.

As shown in FIG. 4I, the method may include depositing a further electrically insulating (oxide) liner layer 422 in the plurality of compensation region contact trench structures 419 and in the plurality of first doping region contact trench structures 421. The electrically insulating liner layer 422 may be deposited at the sidewalls of the compensation region contact trench structures 419 and the first doping region contact trench structures 421, for example. The electrically insulating liner layer 422 may have a thickness of at least 100 nm (or e.g. at least 200 nm, or e.g. about 150 nm), for example.

After depositing the electrically insulating liner layer 422, further etching of the plurality of compensation region contact trench structures 419 and the plurality of first doping region contact trench structures 421 such that each compensation region contact trench structure 419 of the plurality of compensation region contact trench structures 419 may extend into a compensation region 103 of the plurality of compensation regions 103 and each first doping region contact trench structure 421 may extend into a first doping region 106 of the plurality of first doping regions 106.

An oxide etching process may be carried out for etching the electrically insulating liner layer 422 and/or exposed regions of the gate oxide layer 414 in the compensation region contact trench structures 419 and the first doping region contact trench structures 421, for example. The oxide etching process may be selective to silicon, for example. The oxide etching process may be followed by a silicon-based etching process for etching at least part of the plurality of compensation regions 103 exposed by the removal of the gate oxide layer 414 at the bottom of the compensation region contact trench structures 419 and for etching at least part of the plurality of first doping regions 106 exposed by the removal of the gate oxide layer 414 at the bottom of the first doping region contact trench structures 421.

The extended compensation region contact trench structures 419 may extend into the compensation regions 103 to a depth of between 0.2% and 10% (or e.g. between 0.5% and 1%) of the vertical depth of the compensation regions 103, for example. The compensation region contact trench structures 419 may be formed in the compensation regions 103 extending laterally in the second lateral direction, dy, orthogonal to the first lateral direction, dx.

FIG. 4J shows a schematic illustration 491 of the forming of a plurality of compensation region contact structures 423 and a plurality of first doping region contact structures 424, for example. The plurality of compensation region contact structures 423 and the plurality of first doping region contact structures 424 may be referred to as contact hole structures, for example. The plurality of compensation region contact structures 423 and the plurality of first doping region contact structures 424 may be formed after forming the plurality of compensation region contact trench structures and the plurality of first doping region contact trench structures, for example.

The method may include incorporating dopant atoms (e.g. by implantation) into the compensation regions 103 to form highly doped regions 425 having the second conductivity type (e.g. p+ doped regions) in the compensation regions 103. The highly doped regions 425 of the compensation regions 103 may be formed at interfaces between the bottom of the compensation region contact trench structures 419 and the compensation regions 103, for example. For example, each highly doped region 425 of the compensation region 103 may be formed at an interface between the bottom of a compensation region contact trench structure 419 and the compensation region 103.

The method may further include forming the plurality of compensation region contact structures 423 and the plurality of first doping region contact structures 424 after forming the highly doped regions 425 of the compensation regions 103, for example. Forming the plurality of compensation region contact structures 423 and the plurality of first doping region contact structures 424 may include forming interface layers 427, 428 and depositing electrically conductive material in the plurality of compensation region contact trench structures 419 and the plurality of first doping region contact trench structures 421, for example.

The compensation region contact interface layers 428 of the compensation region contact structures 423 may be formed on (or directly adjacent to) the highly doped regions 425 of the compensation regions 103, for example. The compensation region contact interface layers 428 may be formed at an interface between the compensation region contact structures 423 and the compensation regions 103, for example.

The first doping region contact interface layers 427 of the first doping region contact structure 424 may be formed on (or directly adjacent to) the first doping region 106. For example, the first doping region contact interface layers 427 may be formed at an interface between the first doping region contact structures 424 and the first doping region 106, for example.

The material of the first doping region contact interface layers 427 and the material of compensation region contact interface layers 428 may be a metal silicide e.g. titanium silicide (Ti—Si), for example. Additionally or optionally, the material of the first doping region contact interface layers 427 and the material of the compensation region contact interface layers 428 may be different, for example.

Forming the plurality of compensation region contact structures 423 and the plurality of first doping region contact structures 424 may further include depositing electrically conductive material in the plurality of compensation region contact trench structures 419 and in the plurality of first doping region contact trench structures 421 to form the plurality of compensation region contact structures 423 and the plurality of first doping region contact structures 424, for example. The electrically conductive material may be deposited in the plurality of compensation region contact trench structures 419 and in the plurality of first doping region contact trench structures 421 in a single (or the same) deposition process after forming the interface layers 427, 428, for example. The deposited electrically conductive material may at least partially fill the plurality of compensation region contact trench structures 419 and the plurality of first doping region contact trench structures 421, for example. The electrically conductive material forming the plurality of compensation region contact structures 423 and the plurality of first doping region contact structures 424 may include or may be copper, tungsten, aluminum or alloys of these materials or polysilicon, for example.

Additionally or optionally, the first doping region contact structure 423 may provide a short circuit connection between a part of the first doping region 106 of the transistor structure and a part of the body region 104 of the transistor structure. For example, additionally or optionally, the silicon-based etching process described in FIG. 4I may etch parts of the body regions 104 so that first doping region contact trench structures 421 extends at least partially into the body region 104 at certain regions of the body region 104. For example, the body region 104 may be etched in certain regions along a lateral length (e.g. in a second lateral direction, dy) of the body region 104, for example. For example, each first doping region contact trench structure 421 may extend into the body region 104 at certain regions along the lateral length of the body region 104. The etch depth at which the first doping region contact trench structure 421 extends into the body region 104, may lie between 100 nm and 2 μm, for example.

Optionally, the dopant atoms for forming the highly doped regions 425 of the compensation regions 103 may be incorporated into the body region 104 at the etched regions of the body region 104 to form highly doped regions 426 having the second conductivity type (e.g. p+ doped regions) in the body region 104, for example. Other parts of the body region (along the second lateral direction, dy) of the transistor structure and other pails of the first doping region 106 (along the second lateral direction, dy) of the transistor structure may be free from the highly doped region 426 (e.g. the highly doped region 426 is not formed along the entire lateral length of the body region 104 along the second lateral direction, dy), for example. Each doped region 426 may be formed between the bottom of the first doping region contact trench structure 421 and the first doping region 106 at a part of the body region 104 at which a body-source short is to be formed, for example.

Each highly doped region 426 may provide an electrically conductive path for forming a short circuit connection (e.g. a body-source short) between a part of the first doping region 106 of the transistor structure and a part of the body region of the transistor structure. An electrically conductive structure, (e.g. which may be part of the first doping contact structure 424 formed in the first doping region contact trench structure 421), may form a body-source short circuit between the body region 104 of the transistor structure and the first doping region 106 of the transistor structure in the etched parts of the body region 104.

The highly doped regions 425 of the compensation regions 103 and the highly doped regions 426 of the body regions 104 may be formed (simultaneously) in a common (implantation) process, for example. The first doping region contact interface layers 427 of the first doping region contact structure 424 may be formed on (or directly adjacent to) the highly doped regions 426 of the body regions 104 at the regions of the body region 104 at which the body-source shorts are to be formed, for example.

The material of the first doping region contact interface layers 427 and a doping concentration of the highly doped regions 426 of the body regions 104 may be chosen to control or vary a contact resistance between the first doping region contact structures 423 and the body regions 104 of the transistor structures (at the body-short regions). The material of the compensation region contact interface layers 428 and a doping concentration of the highly doped regions 425 of the compensation regions 103 may be chosen to control or vary a contact resistance between the compensation region contact structures 423 and the compensation regions 103 of the transistor structures, for example. A contact resistance between the first doping region contact structure 424 and the first doping region 106 and/or the body region 104 of the transistor structure may be different from a contact resistance between the compensation region contact structure 423 and the compensation region 103, for example.

Figure 4K:
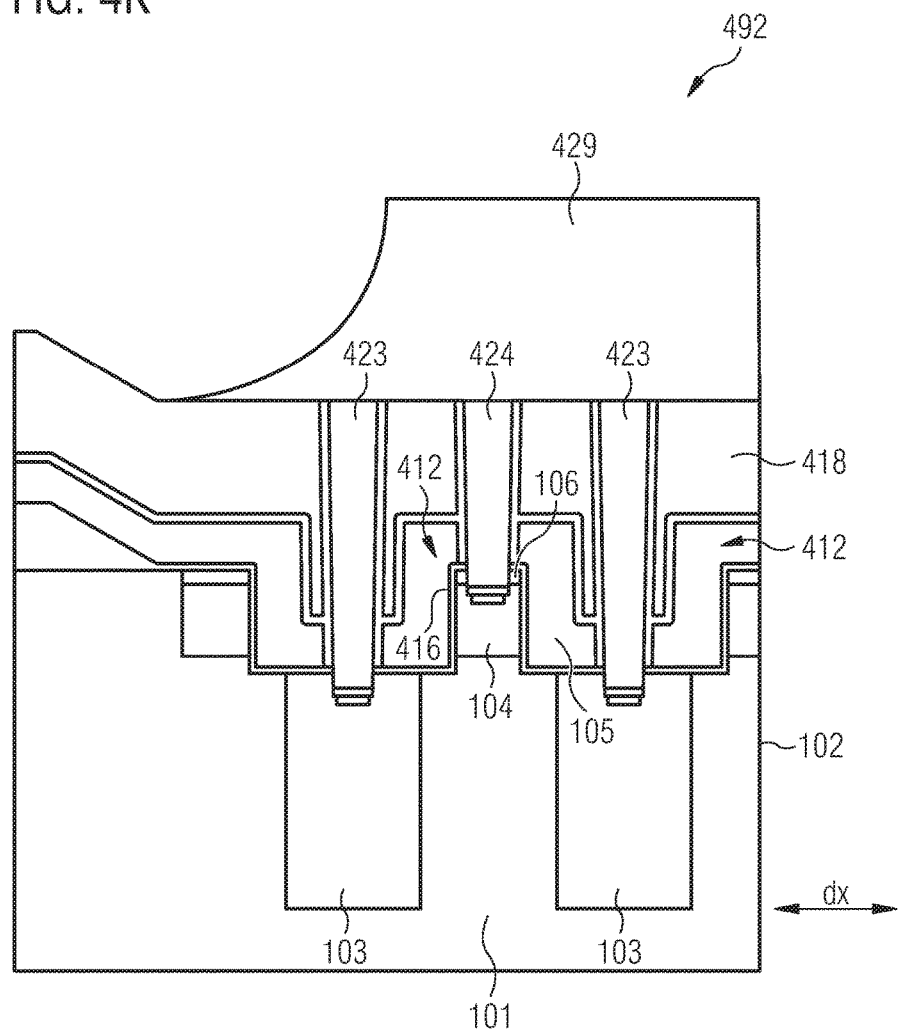

FIG. 4K shows a schematic illustration 492 of a semiconductor device formed by the method described in connection with FIGS. 4A to 4K.

The method may include the forming of metallization contact structures 429 on the plurality of compensation region contact structures 423 and the plurality of first doping region contact structures 424, for example.

The method may include depositing metallization material (e.g. aluminum) on the first side surface of the semiconductor substrate and structuring the metallization material to form the metallization contact structures 429. The metallization contact material may be formed on (e.g. may cover) the electrically insulating filler material 418, the plurality of compensation region contact structures 423 and the plurality of first doping region contact structures 424, for example. Lithography process and etching process (e.g. etching of the aluminum) may be carried out to structure the metallization material to form the metallization contact structures 429, for example. For example, a first metallization structure may provide an electrical connection between the plurality of compensation region contact structures 423 and a second metallization structure may provide an electrical connection between the plurality of first doping region contact structures 424. The method may further include processing with photoimide (e.g. forming a photoimide layer over or between the metallization structures).

More details and aspects are mentioned in connection with the embodiments described above or below. The embodiments shown in FIGS. 4A to 4K may each comprise one or more optional additional features corresponding to one or more aspects mentioned in connection with the proposed concept or one or more embodiments described above (e.g. FIGS. 1 to 3) or below (e.g. FIGS. 5A to 7).

FIG. 5A shows an enlarged view of a schematic illustration 510 of a region surrounding part of a first doping region contact structure 424 of a transistor structure of the semiconductor device.

The first doping region contact structure 424 (e.g. the source contact) may include the first doping region contact interface layer 427. The first doping region contact interface layer 427 may be located at an interface between the first doping region contact structure 424 and the body region 104, for example. For example, the first doping region contact interface layer 427 may be located at an interface between the first doping region contact structure 424 and the highly doped region 426 of the body region 104.

At least a part of the first doping region contact structure 424 may be laterally surrounded by (and/or be directly adjacent to) the first doping region 106 of the transistor structure, for example. At least part of the first doping region contact structure 424 may extend into the body region 104 of the transistor structure, for example. The part of the first doping region contact structure 424 extending into the body region 104 of the transistor structure may provide a short circuit connection between a part of the first doping region 106 of the transistor structure and a part of the body region 104 of the transistor structure, for example.

A part of the electrically insulating liner layer 417 may be located directly adjacent to at least part of the sidewalls of the first doping region contact structure 424, for example. A first gate 105A may be formed on a first sidewall of the self-aligned semiconductor substrate pillar structure 431 comprising the body region 104 of a first transistor structure, for example. The first gate 105A may extend substantially vertically along the body region 104 of the transistor structure, for example. A second gate 105B may be formed on a second sidewall of the self-aligned semiconductor substrate pillar structures 431 comprising the body region 104 of a second transistor structure, for example.

Figure 5B:
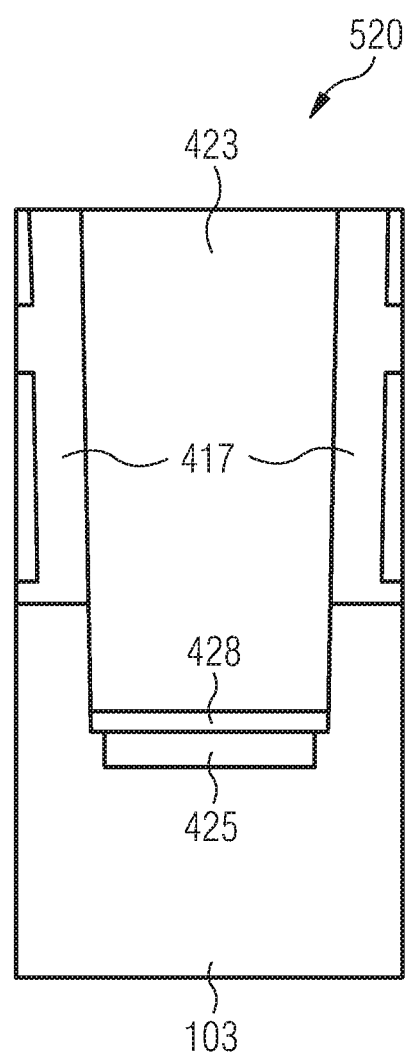
FIG. 5B shows a schematic illustration of a compensation region contact structure of a transistor structure of the semiconductor device.

FIG. 5B shows an enlarged view of a schematic illustration 520 of a region surrounding the compensation region contact structure 423 of a transistor structure of the semiconductor device.

The compensation region contact structure 423 may include the compensation region contact interface layer 425. The compensation region contact interface layer 425 may be located at an interface between the compensation region contact structure 423 and the compensation region 103 (e.g. a p-doped pillar), for example. For example, the compensation region contact interface layer 425 may be located at an interface between the compensation region contact structure 423 and the highly doped region 425 of the compensation region 103.

A (further) part of the electrically insulating liner layer 417 may be located directly adjacent to at least part of the sidewalls of the compensation region contact structure 423, for example.

Figure 5C:
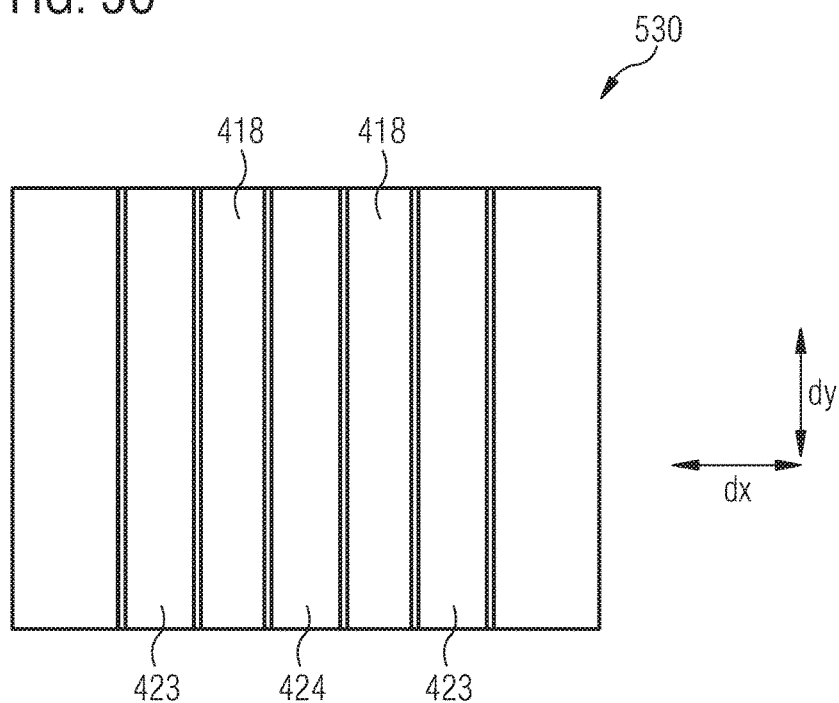
FIGS. 5C and 5D shows schematic illustrations of top view layouts of the compensation region contact structures and the first doping region contact structures.

FIG. 5C shows a schematic illustration 530 of a stripe layout of the compensation region contact structures 423 and the first doping region contact structures 424 of the semiconductor device according to an embodiment.

The top view layout shows striped compensation region contact structures 423 and striped first doping region contact structures 424 which may enable a striped-polysilicon layout for the polysilicon gate structure. For example, the compensation region contact structures 423 and the first doping region contact structures 424 may each continuously extend in a second lateral direction, dy, for example. The compensation region contact structures 423 and the first doping region contact structures 424 may be substantially parallel to each other (e.g. neglecting manufacturing tolerances), for example. For example, a first compensation region contact structure 423 may be spatially separated from a second compensation region contact structure 423 by a lateral spacing in a first lateral direction, dx. The first compensation region contact structure 423 may be spatially separated from a neighboring first doping region contact structure 424 by a lateral spacing in the first lateral direction, for example. It may be understood that the number of compensation region contact structures 423 may be more than 10, (or e.g. more than 50, or e.g. more than 100, or e.g. more than 1000), for example.

Figure 5D:
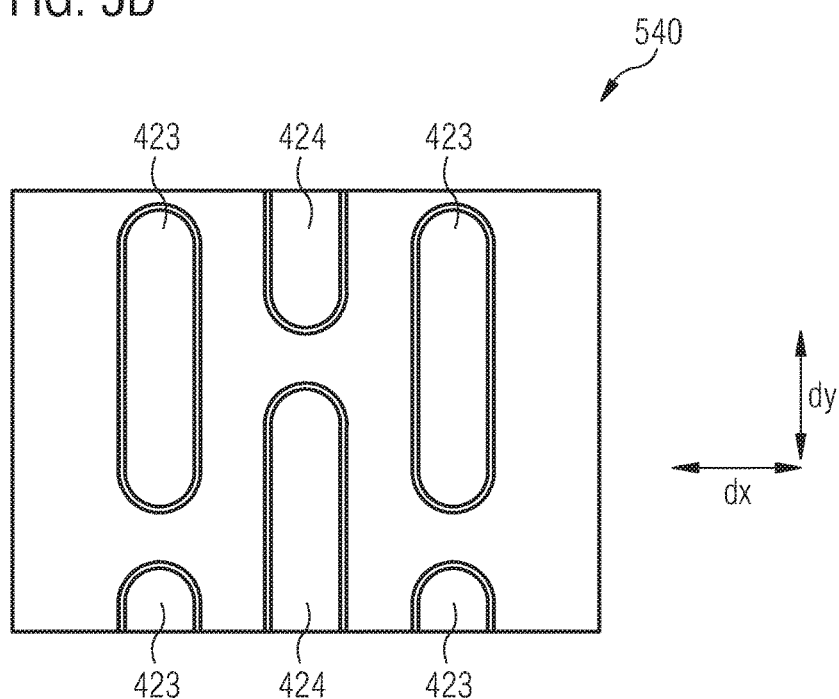

FIG. 5D shows a schematic illustration 540 of a bar layout of the compensation region contact structures 423 and the first doping region contact structures 424 of the semiconductor device according to an embodiment.

The top view layout shows long holes to enable a scattered or interlock layout for the polysilicon gate structure. For example, a first compensation region contact structure 423 may be spatially separated from a second compensation region contact structure 423 by a lateral spacing in the first lateral direction, dx. Additionally, the first compensation region contact structure 423 may be spatially separated from a third compensation region contact structure 423 by a lateral spacing in a second lateral direction, dy.

Additionally or optionally, a first doping region contact structure 424 may be spatially separated from a second doping region contact structure 424 by a lateral spacing in the second lateral direction, dy. Additionally, the first doping region contact structure 424 may be spatially separated from a third doping region contact structure 424 by a lateral spacing in a first lateral direction, dx.

Each compensation region 423 may have a lateral overlap with more than one first doping region contact structure 424, for example. For example, a lateral length of first compensation region 423 may have a lateral overlap (in the first lateral direction) with a first doping region contact structure 424 and a second doping contact structure 424, for example.

More details and aspects are mentioned in connection with the embodiments described above or below. The embodiments shown in FIGS. 5A to 5D may each comprise one or more optional additional features corresponding to one or more aspects mentioned in connection with the proposed concept or one or more embodiments described above (e.g. FIGS. 1 to 4K) or below (e.g. FIGS. 6A to 7).

FIGS. 6A to 6J show schematic illustrations of a method for forming a semiconductor device according to an embodiment.

The method described in connection with FIGS. 6A to 6J may be similar to the method described in connection with FIG. 3 and FIGS. 4A to 4K, for example.

Figure 6A:
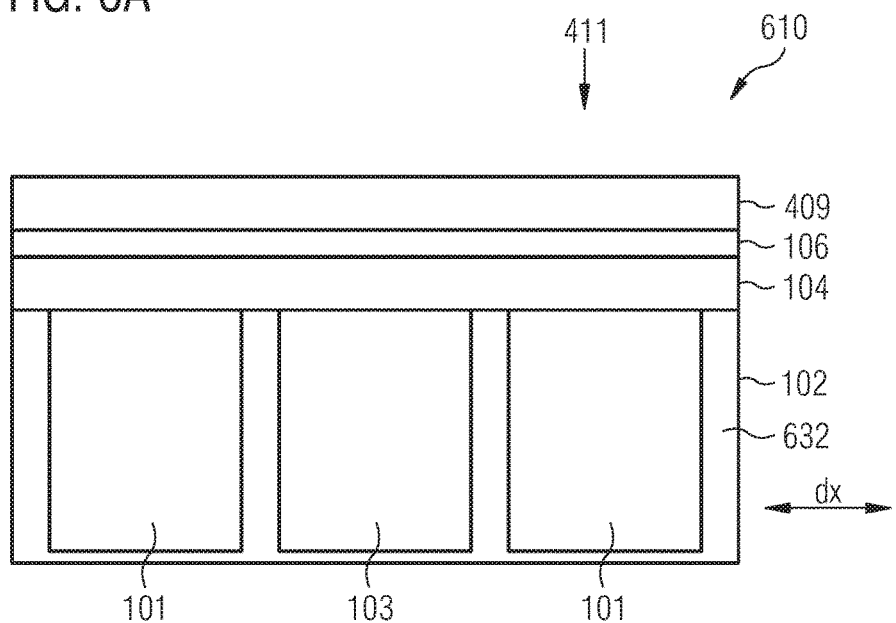

FIG. 6A shows a schematic illustration 610 of a substructure of column structures. The column structures formed may be a plurality of alternating drift regions 101 and a plurality of compensation regions 103 located in the semiconductor substrate 102. For example, the plurality of drift regions 101 and the plurality of compensation regions 103 may be arranged alternatingly in at least one lateral direction (e.g. the first lateral direction dx), for example. The plurality of drift regions 101 may have an opposite doping to the plurality of compensation regions 103. For example, the plurality of drift regions 101 may have an n-type doping and the plurality of compensation regions 103 may have a p-type doping, or vice versa. Optionally, each drift region 101 of the plurality of drift regions 101 may be located directly adjacent to a compensation region 103 of the plurality of compensation regions 103. Alternatively or optionally, a depletion region 632 may be located between the drift regions 101 and the compensations regions 103 (e.g. a p-n junction), for example.

FIG. 6A further shows the forming of a body region 104 of a vertical field effect transistor arrangement in the semiconductor substrate 102, and the forming of a first doping region 106 on the body region 104. Optionally, the body region 104 and the first doping region 106 may be formed after forming the plurality of compensation regions 103 and the plurality of drift regions 101) in the semiconductor substrate 102, for example.

The body region 104 may be a lightly doped p-type doped silicon epitaxial layer, for example. The first doping region 106 may be a highly doped n-type doped silicon epitaxial layer located on the body region 104, for example. Alternatively or optionally, the body region 104 may be formed by the implantation (and out-diffusing) of atoms to form a body implant region over the majority of (or the whole) surface area of the first side surface 411 of the semiconductor substrate 102. Additionally or optionally, the first doping region 106 may be formed by the implantation (an out-diffusing) of atoms to form the first doping region implant region over the majority of (or the whole) surface area of the first side surface 411 of the semiconductor substrate 102.

The body region 104 may be formed deeper into the semiconductor substrate 102 from the first side surface 411 in a substantially vertical direction than the first doping region 106. The body region 104 may have a (vertical) thickness between 500 nm and 1 μm, for example. The first doping region 106 may have a (vertical) thickness between 100 nm and 200 nm, for example. The thickness of the body region 104 may be larger than the thickness of the first doping region 106, for example.

FIG. 6A further shows the forming of a hard mask layer 409 over a first (or front) side surface 411 of the semiconductor substrate 102. The hard mask layer 409 may be a silicon oxide (e.g. silicon dioxide) layer, for example.

Figure 6B:
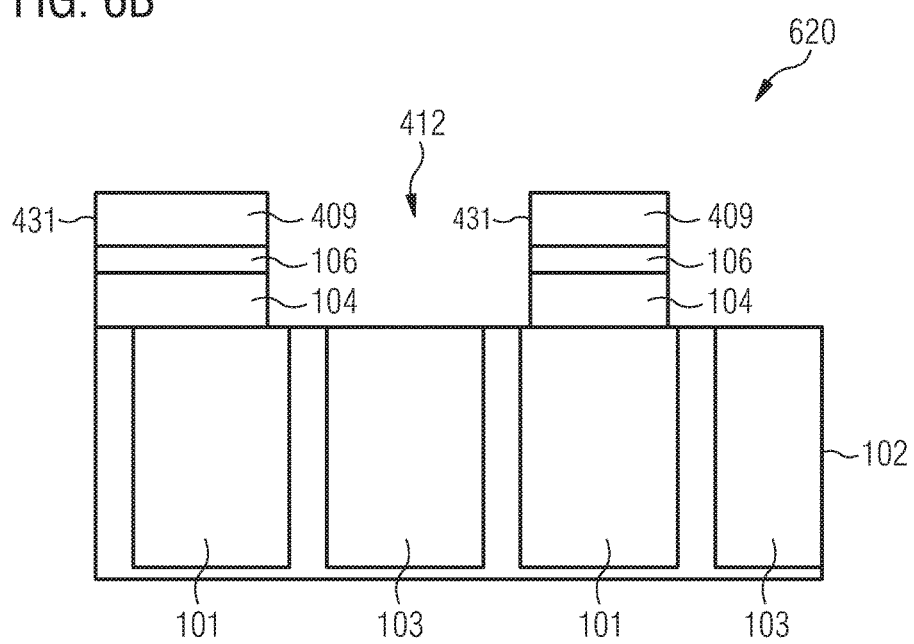

FIG. 6B shows a schematic illustration 620 of the forming of a plurality of gate trench structures 412 in the semiconductor substrate 102 using trench lithography and trench etching.

The forming the plurality of gate trench structures 412 by lithography may lead to a plurality of semiconductor substrate pillar structures 431 being formed. Each semiconductor substrate pillar structure 431 may be located adjacent to a gate trench structure 412 of the plurality of gate trench structures 412. Each semiconductor substrate pillar structures 431 of the plurality of semiconductor substrate pillar structures 431 may be located on a drift region 101 of the plurality of drift regions 101, for example. Each semiconductor substrate pillar structure 431 of the plurality of semiconductor substrate pillar structures 431 may include a body region 104 of at least one transistor structure and the first doping region 106 of the at least one transistor structure, for example.

FIG. 6C shows a schematic illustration 630 of the forming of the gate structure 416 on the first side surface 411 of the semiconductor substrate 102. The gate structure 416 may be formed on the bottom and side walls of the plurality of gate trench structures 412, for example. Furthermore, the gate structure 416 may be formed on the side walls and on the top walls of the plurality of semiconductor substrate pillar structures 431, for example. The gate structure 416 may include a conformal gate oxide layer 414 (e.g. a silicon dioxide layer) and a gate contact layer 415 (e.g. a tungsten or a polysilicon layer) located on the gate oxide layer 414, for example.

FIG. 6D shows a schematic illustration 640 of the forming of the plurality of gates 105 from the gate structure 416 comprising the gate oxide layer 414 and the gate contact layer 415.

The gates 105 may be formed by lithography and etching to remove portions of the gate structure 416 at selected regions. The parts of the gate structure 416 remaining at the first side surface 411 of the semiconductor substrate 102 after lithography and etching may form the plurality of gates 105, for example. The plurality of gates 105 may remain at least on the sidewalls of the plurality of semiconductor substrate pillar structures 431 (or at least on the sidewalls of the plurality of gate trench structures 412), for example: The plurality of gates 105 may be located directly adjacent to the body regions 104 of the transistor structures of the vertical FET arrangement.

Optionally a further silicon dioxide layer may be formed on the gate contact layer 415 (e.g. the polysilicon gate layer) of the gates 105 located at the sidewalls of the plurality of gate trench structures 412. The further silicon dioxide layer may improve electric field distribution at corners of the gates 105, for example.

The removal of parts of the gate structure 416 may form gate isolating trench structures 633, 634 between neighboring gates 105 of the plurality of gates 105. A first plurality of gate isolating trench structures 633 may be formed in the plurality of gate trench structures 412. For example, gate isolating trench structure 633 of the first plurality of gate isolating trench structures 633 may be formed between neighboring gates 105 located at the sidewalls of a gate trench structure 412. A second plurality of gate isolating trench structures 634 may be located on the plurality of semiconductor substrate pillar structures 431. For example, each gate isolating trench structure 634 of the second plurality of gate isolating trench structures 634 may be formed between neighboring gates 105 located at the sidewalls of a semiconductor substrate pillar structure 431, for example.

Figure 6E:
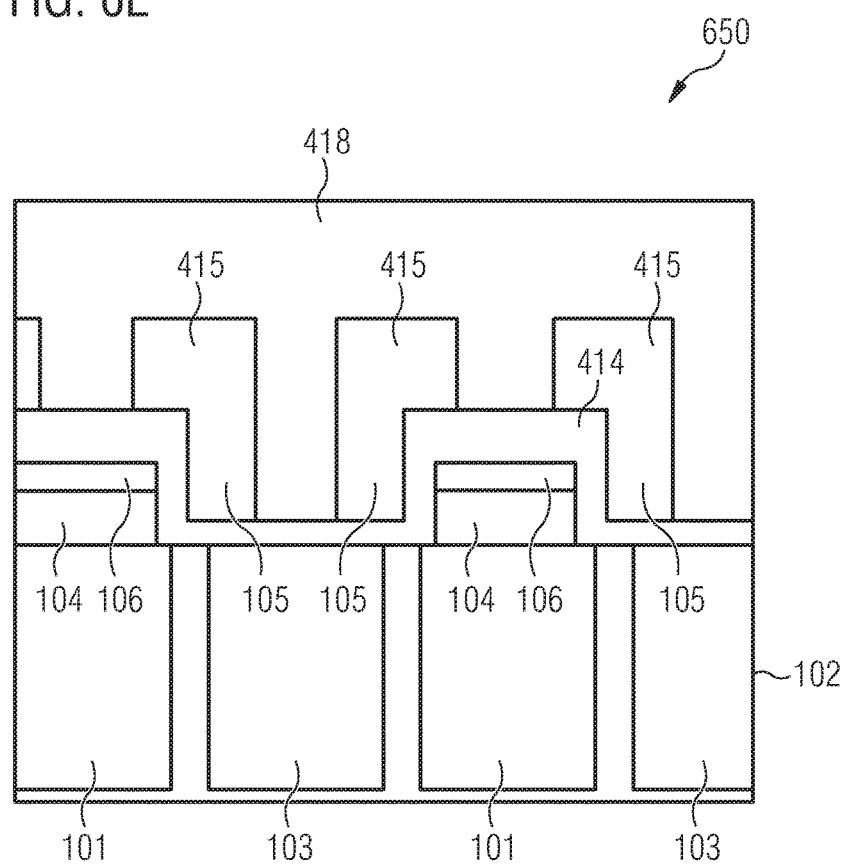

FIG. 6E shows a schematic illustration 650 of the forming of the electrically insulating filler material 418 between the plurality of gates 105 of the vertical FET arrangement.

The electrically insulating filler material 418 may be formed by depositing and reflowing borophosphosilicate glass (BPSG) between the neighboring gates 105 of the plurality of gates 105, followed by an annealing process, for example. For example, at least part of the electrically insulating filler material 418 may be formed in the first plurality of gate isolating trench structures 633 and the second plurality of gate isolating trench structures 634, for example. For example, the electrically insulating filler material 418 may at least partially the first plurality of gate isolating trench structures 633 and the second plurality of gate isolating trench structures 634, for example.

Optionally, an electrically insulating liner layer (e.g. a Tetraethyl orthosilicate TEOS layer) may be formed conformally on the gate contact layers 415 of the gates 105 before depositing the electrically insulating filler material 418, for example. The electrically insulating liner layer may prevent or reduce the diffusion of atoms or ions which may be used in previous or subsequent doping processes or are diffusing out of the mold material, for example.

FIG. 6F shows a schematic illustration 660 of the forming of a plurality of compensation region contact trench structures 419 and the plurality of first doping region contact trench structures 421.

Each compensation region contact trench structure 419 of the plurality of compensation region contact trench structures 419 may be formed in (or extend through) the electrically insulating filler material 418 in a region of the electrically insulating filler material 418 located between neighboring gates 105 located on opposite sidewalls of a gate trench structure 412. Each compensation region contact trench structure 419 of the plurality of compensation region contact trench structures 419 may be formed on a compensation region 103 of the plurality of compensation regions 103, for example. The bottom of each compensation region contact trench structure 419 may lie directly on or directly adjacent to a compensation region 103 of the plurality of compensation regions 103, for example.

Each first doping region contact trench structure 421 of the plurality of first doping region contact trench structures 421 may be formed in (or extend through) the electrically insulating filler material 418 in a region of the electrically insulating filler material 418 located between neighboring gates 105 located on sidewalls of a semiconductor substrate pillar structure 431 of the plurality of semiconductor substrate pillar structures 431. The bottom of each first doping region contact trench structure 421 may lie directly on or directly adjacent to a first doping region 106 of the plurality of first doping regions 106, for example.

The plurality of compensation region contact trench structures 419 and the plurality of first doping region contact trench structures 421 may be formed by a lithography process and a subsequent etching process for forming the contact holes, for example. The etching process may etch the BPSG electrically insulating filler material 418 and the parts of the gate oxide layer 414 so that the bottom of each compensation region contact trench structure 419 may lie directly on or directly adjacent to a compensation region 103, and so that the bottom of each first doping region contact trench structure 421 may lie directly on or directly adjacent to a first doping region 106, for example. Etching into the silicon below the contact trench structures may be omitted, for example.

FIG. 6G shows a schematic illustration 670 of the forming of highly doped regions 625, 626 having the second conductivity type (e.g. p+ doped regions) in the compensation regions 103 and in the body regions 104, for example. The highly doped regions 625, 626 may be formed in the desired regions by lithography and implanting dopant atoms (e.g. boron atoms) in the desired regions e.g. over the p-type compensation region columns and in the contact holes), for example.

The highly doped regions 625 of the compensation regions 103 may be formed at interfaces between the bottom of the compensation region contact trench structures 419 and the compensation regions 103, for example. The highly doped regions 626 of the body region 104 may be formed at interfaces between the bottom of the first doping region contact trench structures 421 and the first doping regions 106, for example. Each transistor structure of the vertical FET arrangement may include at least one highly doped region 626, which may provide an electrically conductive contact structure for forming a short circuit connection between a part of the first doping region 106 of the transistor structure and a part of the body region 104 of the transistor structure.

Each highly doped region 626 may be formed at least partially in the body region 104 of the transistor structure and at least partially in the first doping region 106 of the transistor structure. For example, the highly doped region 626 may be formed at least partially in a portion (e.g. at cross-section A) of the body region 104 and a portion of the first doping region 106 along a lateral length (in the second lateral direction, dy) of the body region 104 and the first doping region 106. Other portions (e.g. at cross-section B) of the body region 104 and the first doping region 106 along the lateral length (in the second lateral direction, dy) may be free from the highly doped region 626, for example. For example, the highly doped region 626 is not formed in these other parts of the body region 104 and these other parts of the first doping region 106, for example.

FIG. 6H shows a schematic illustration 680 of a semiconductor device formed by the method described in connection with FIGS. 6A to 6H. The method may include the forming of a plurality of compensation region contact structures 423 and a plurality of first doping region contact structures 424.

Forming the plurality of compensation region contact structures 423 and the plurality of first doping region contact structures 424 may include forming the interface layers 427, 428 and depositing the electrically conductive material in the plurality of compensation region contact trench structures 419 and the plurality of first doping region contact trench structures 421 after forming the interface layers 427, 428, for example.

The first doping region contact interface layers 427 may be formed on (or directly adjacent to) the highly doped regions 426 of the body regions 104, for example. For example, the first doping region contact interface layers 427 may be formed at an interface between the first doping region contact structures 424 and the first doping region 106 (e.g. at cross-section B), and/or at an interface between the first doping region contact structures 424 and the highly doped regions 626 of the body region 104 (e.g. at cross-section A), for example. The compensation region contact interface layers 428 may be formed on (or directly adjacent to) the highly doped regions 425 of the compensation regions 103, for example. The compensation region contact interface layers 428 may be formed at an interface between the compensation region contact structures 423 and the compensation regions 103, for example. The material of the first doping region contact interface layers 427 and the compensation region contact interface layers 428 may be a metal silicide, e.g. titanium silicide (Ti—Si), for example.

The electrically conductive material forming the plurality of compensation region contact trench structures 419 and the plurality of first doping region contact trench structures 421 may be deposited in the plurality of compensation region contact trench structures 419 and in the plurality of first doping region contact trench structures 421 (e.g. poly-contact hole filling), for example. The electrically conductive material may include or may be copper, tungsten, aluminum or alloys of these materials, or polysilicon, for example.

Metallization contact structures 429 may be formed on the plurality of compensation region contact structures 423 and the plurality of first doping region contact structures 424, for example. For example, a first metallization structure may provide an electrical connection between the plurality of compensation region contact structures 423 and a second metallization structure may provide an electrical connection between the plurality of first doping region contact structures 424

Metallization material (e.g. aluminum) may be deposited on the first side surface of the semiconductor substrate and structuring of the metallization material may be carried out to form the metallization contact structures 429, for example.

Figure 6I:
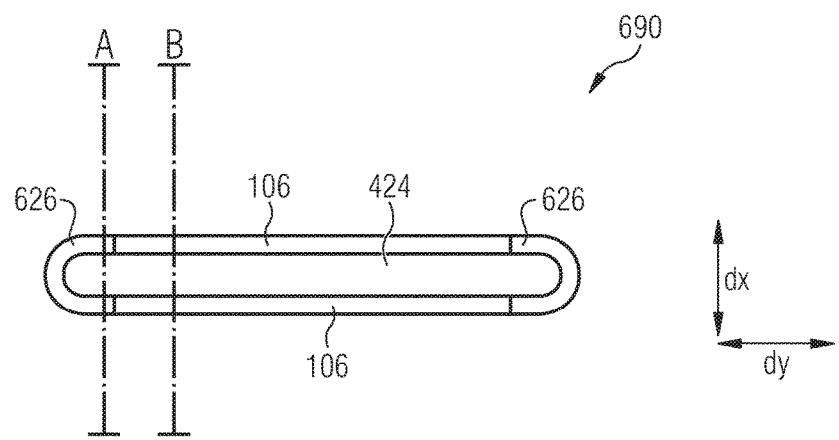

FIG. 6I shows a schematic illustration 690 of a top view of a first doping region contact structure 424 of a transistor structure of the vertical FET arrangement. The first doping region contact structure 424 may extend laterally in a first lateral direction, dx, and in a second lateral direction, dy. The first doping region contact structure 424 shown in FIG. 6I may correspond to the first doping region contact structure 424 having the bar layout described in connection with FIG. 5D.

As shown in FIG. 6I, the highly doped region 626 of a transistor structure may be formed in at least one part of the body region 104 of the transistor structure and in at least one part of the first doping region 106 of the transistor structure. The highly doped region 626 of the transistor structure may provide an electrically conductive contact structure for forming a short circuit connection between a part of the first doping region 106 of the transistor structure and a part of the body region of the transistor structure. Other parts of the body region (along the second lateral direction, dy) of the transistor structure and other parts of the first doping region 106 (along the second lateral direction, dy) of the transistor structure may be free from the highly doped region 626, for example. The first doping region contact structure 424 (e.g. the poly silicon contact) may be short circuited to the (n-type doped) source region and the (p-type doped) body region, for example.

Due to the formation of the p-type doped silicon epitaxial layer (for forming the body region 104), the channel length may be controlled through the well controllable thickness of the p-type doped silicon epitaxial layer, and not through an implantation or subsequent out-diffusion. The contact to the p-type doped pillar may be optimized independently from the source and body contact, so that a better resistance to cosmic radiation or other failure mechanisms may be obtained, for example. The source contact and the entire source region may have a lower (ohmic) resistance (than the compensation region contact, which may achieve a smaller turn on resistance Ron.

Figure 6J:
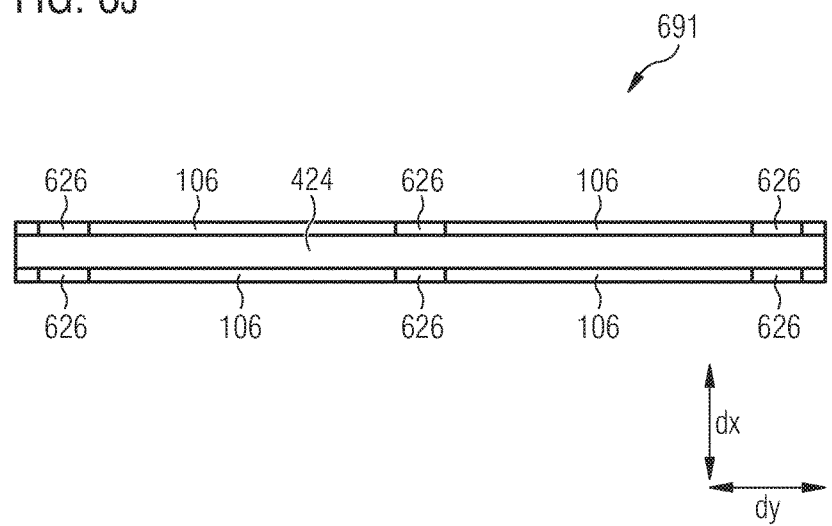

FIG. 6J shows a schematic illustration 691 of a top view of a first doping region contact structure 424 of a transistor structure of the vertical FET arrangement. The first doping region contact structure 424 may extend laterally in a first lateral direction, dx, and in a second lateral direction, dy. The first doping region contact structure 424 shown in FIG. 6J may correspond to the first doping region contact structure 424 having the stripe layout described in connection with FIG. 5C.

A plurality of highly doped regions 626 may be arranged adjacent to the first doping region contact structure 424 along the second lateral direction, dy. Each highly doped region 626 may be separated from a neighboring highly doped region 626 by a separation distance. Each highly doped region 626 of the plurality of highly doped regions 626 may be formed in at least one part of the body region 104 of a transistor structure and in at least one part of the first doping region 106 of the transistor structure. For example, (first) highly doped region 626 of the plurality of highly doped regions 626 may provide an electrically conductive contact structure for forming a short circuit connection between a part of the first doping region 106 of the transistor structure and a part of the body region of the transistor structure. A neighboring (second) highly doped region 626 may provide an electrically conductive contact structure for forming a short circuit connection between a part of the first doping region 106 of a neighboring (or different) transistor structure and a part of the body region of the neighboring transistor structure, for example.

More details and aspects are mentioned in connection with the embodiments described above or below. The embodiments shown in FIGS. 6A to 6J may each comprise one or more optional additional features corresponding to one or more aspects mentioned in connection with the proposed concept or one or more embodiments described above FIGS. 1 to 5D) or below (FIG. 7).

FIG. 7 shows a schematic illustration of a method 700 for forming a semiconductor device.

The method 700 comprises forming 710 a plurality of compensation regions comprising semiconductor material within a plurality of compensation trench structures located in a semiconductor substrate.

The method 700 further comprises forming 720 a plurality of self-aligned gate trench structures based on portions of the plurality of compensation trench structures without semiconductor material.

Due to the forming of a plurality of self-aligned gate trench structures based on portions of the plurality of compensation trench structures without semiconductor material, process reliability may be increased, and increased shrinkage of CoolMOS cells (e.g. compensation devices) may be achieved without using additional lithography and therefore reducing expenses. Through the forming of self-aligned gate trench structures, lithography processes (e.g. etching of the gate structures) may be eliminated or reduced, for example.

The method 700 for forming the semiconductor device may be similar to the methods described in connection with FIG. 3 and FIGS. 4A to 4K. For example, self-aligned pillar structures may be formed based on the forming of the plurality of self-aligned gate trench structures. The portions of the plurality of compensation trench structures without semiconductor material may be portions of the plurality of compensation trench structures remaining unfilled after forming the plurality of compensation regions comprising semiconductor material, for example. Alternatively or optionally, the portions of the plurality of compensation trench structures without semiconductor material may be portions of the plurality of compensation trench structures in which epitaxial semiconductor material may be first deposited, and subsequently removed (e.g. by etching or CMP) to form portions of the plurality of compensation trench structures without semiconductor material, for example.

By forming a plurality of gates of a vertical field effect transistor arrangement at sidewalls of the plurality of gate trench structures, the plurality of gates may also be self-aligned without introducing additional lithography processes, for example.

More details and aspects are mentioned in connection with the embodiments described above or below. The embodiments shown in FIG. 7 may each comprise one or more optional additional features corresponding to one or more aspects mentioned in connection with the proposed concept or one or more embodiments described above (e.g. FIGS. 1 to 6J) or below.

Various embodiments relate to compensation devices with trench cells (e.g. CoolMOS transistor structures with trench cells). Various embodiments relate to three-dimensional gate structures for compensation devices (e.g. CoolMOS transistor structures). The embodiments may relate to forming a superstructure of a transistor structure by a self-alignment process over a trench sub structure. The embodiments may relate to the application of three-dimensional gate structures and different (e.g. two) contact structures for the source/body region and the p-column, for example.

Aspects and features (e.g. the semiconductor device, the vertical field effect transistor arrangement, the semiconductor substrate, the plurality of drift regions, the plurality of compensation regions, the first conductivity type, the second conductivity type, the body region, the first doping region, the second doping region, the gate, the gate trench structure, the first doping region contact structure, the compensation region contact structure, the compensation trench structures, the self-aligned semiconductor substrate pillar structures, the gate structures) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
    a plurality of drift regions of a vertical field effect transistor arrangement arranged in a semiconductor substrate, wherein the plurality of drift regions comprises a first conductivity type;
    a plurality of compensation regions arranged in the semiconductor substrate, wherein the plurality of compensation regions comprise a second conductivity type, wherein each drift region of the plurality of drift regions is arranged adjacent to at least one compensation region of the plurality of compensation regions;
    a body region of a transistor structure of the vertical field effect transistor arrangement arranged adjacent to a drift region of the plurality of drift regions; and
    a gate extending substantially vertically along the body region of the transistor structure for controlling a substantially vertical channel region between a first doping region of the transistor structure and the drift region,
    wherein at least part of the gate is formed on at least one sidewall of a gate trench structure located adjacent to the body region of the transistor structure,
    wherein the body region of the transistor structure and the first doping region of the transistor structure are located in a portion of the semiconductor substrate located laterally between the gate trench structure and a further gate trench structure of a plurality of gate trench structures comprising gates of transistor structures of the vertical field effect transistor arrangement,
    wherein the portion of the semiconductor substrate comprising the body region of the transistor structure and the first doping region of the transistor structure has a lateral dimension smaller than a lateral dimension of the drift region of the transistor structure.

2. The semiconductor device of claim 1, compensation region of the plurality of compensation regions extends from a bottom of the gate trench structure into the semiconductor substrate.

3. The semiconductor device of claim 1, wherein the portion of the semiconductor substrate comprising the body region of the transistor structure and the first doping region of the transistor structure has a lateral dimension of between 500 nm and 5 µm.

4. The semiconductor device of claim 1, further comprising an electrically conductive contact structure forming a short circuit connection between a part of the first doping region of the transistor structure and a part of the body region of the transistor structure.

5. The semiconductor device of claim 4, wherein the electrically conductive contact structure is in contact with the first doping region of the transistor structure and the body region of the transistor structure within one contact trench of the transistor structure.

6. The semiconductor device of claim 1, wherein the compensation region and the body region of the transistor structure are separated within the semiconductor substrate by at least one p-n junction.

7. A semiconductor device, comprising:
    a plurality of drift regions of a vertical field effect transistor arrangement arranged in a semiconductor substrate, wherein the plurality of drift regions comprises a first conductivity type;
    a plurality of compensation regions arranged in the semiconductor substrate, wherein the plurality of compensation regions comprise a second conductivity type, wherein each drift region of the plurality of drift regions is arranged adjacent to at least one compensation region of the plurality of compensation regions;
    a body region of a transistor structure of the vertical field effect transistor arrangement arranged adjacent to a drift region of the plurality of drift regions; and
    a gate extending substantially vertically along the body region of the transistor structure for controlling a substantially vertical channel region between a first doping region of the transistor structure and the drift region,
    wherein at least part of a gate structure forming the gate of the transistor structure is located laterally between at least part of a first doping region contact c e in electrical connection with the first doping region of the transistor structure and at least part of a compensation region contact structure in electrical connection with the compensation region adjacent to the drift region of the transistor structure.

8. The semiconductor device of claim 7, wherein a contact resistance between the first doping region contact structure and the first doping region of the transistor structure is different from a contact resistance between the compensation region contact structure and the compensation region.

9. The semiconductor device of claim 7, wherein the compensation region contact structure is in contact with the compensation region within the gate structure.

10. The semiconductor device of claim 7, wherein the compensation region contact structure is laterally surrounded by at least part of the gate structure.

11. A semiconductor device, comprising:
a plurality of drift regions of a vertical field effect transistor arrangement arranged in a semiconductor substrate, wherein the plurality of drift regions comprises a first conductivity type;
a plurality of compensation regions arranged in the semiconductor substrate, wherein the plurality of compensation regions comprise a second conductivity type, wherein each drift region of the plurality of drift regions is arranged adjacent to at least one compensation region of the plurality of compensation regions;
a body region of a transistor structure of the vertical field effect transistor arrangement arranged adjacent to a drift region of the plurality of drift regions;
a gate extending substantially vertically along the body region of the transistor structure for controlling a substantially vertical channel region between a first doping region of the transistor structure and the drift region; and
an electrically conductive contact structure forming a short circuit connection between a part of the first doping region of the transistor structure and a part of the body region of the transistor structure.

12. The semiconductor device of claim 11, wherein the electrically conductive contact structure is in contact with the first doping region of the transistor structure and the body region of the transistor structure within one contact trench of the transistor structure.

13. A semiconductor device, comprising:
a drift region of a vertical field effect transistor arrangement arranged in a semiconductor substrate, wherein the drift region comprises a first conductivity type;
a compensation region arranged in the semiconductor substrate and comprising a second conductivity type, wherein the drift region is arranged adjacent to the compensation region;
a body region of a transistor structure of the vertical field effect transistor arrangement arranged adjacent to the drift region, wherein the body region comprises the second conductivity type, wherein the body region has a smaller lateral dimension than that of the drift region so as to not overlap the compensation region; and
a gate extending substantially vertically along the body region for controlling a substantially vertical channel region between a first doping region of the transistor structure and the drift region.

14. The semiconductor device of claim 13, wherein at least part of a gate structure forming the gate of the transistor structure is located laterally between at least part of a first doping region contact structure in electrical connection with the first doping region and at least part of a compensation region contact structure in electrical connection with the compensation region.

15. The semiconductor device of claim 14, wherein a contact resistance between the first doping region contact structure and the first doping region is different from a contact resistance between the compensation region contact structure and the compensation region.

16. The semiconductor device of claim 14, wherein the compensation region contact structure is in contact with the compensation region within the gate trench structure.

17. The semiconductor device of claim 14, wherein the compensation region contact structure is laterally surrounded by at least part of the gate structure.

18. The semiconductor device of claim 13, further comprising an electrically conductive contact structure forming a short circuit connection between a part of the first doping region and a part of the body region.

19. The semiconductor device of claim 18, wherein the electrically conductive contract structure is in contact with the first doping region and the body region within one contact trench of the transistor structure.

20. The semiconductor device of claim 13, wherein the compensation region and the body region are separated within the semiconductor substrate by at least one p-n junction.

21. The semiconductor device of claim 13, wherein at least part of the gate is formed on at least one sidewall of a gate trench structure located adjacent to the body region.

22. The semiconductor device of claim 21, wherein the body region and the first doping region are located in a portion of the semiconductor substrate located laterally between the gate trench structure and a further gate trench structure of the vertical field effect transistor arrangement.

* * * * *

UNITED STATES PATENT AND TRADEMARK OFFICE
CERTIFICATE OF CORRECTION

PATENT NO. : 10,164,086 B2  
APPLICATION NO. : 15/273400  
DATED : December 25, 2018  
INVENTOR(S) : Tegen et al.

Page 1 of 1

It is certified that error appears in the above-identified patent and that said Letters Patent is hereby corrected as shown below:

In the Claims

Column 34, Line 6 (Claim 2, Line 1), please change "compensation" to -- wherein a compensation --.
Column 34, Line 51 (Claim 7, Line 22), please change "c e" to -- structure --.

Signed and Sealed this  
Nineteenth Day of February, 2019

Andrei Iancu  
*Director of the United States Patent and Trademark Office*